US012666568B2

(12) United States Patent (10) Patent No.: US 12,666,568 B2

Tu et al. (45) Date of Patent: Jun. 23, 2026

(54) IMMERSION COOLING SYSTEM

(71) Applicant: Wiwynn Corporation, New Taipei City (TW)

(72) Inventors: Tai-Ying Tu, New Taipei City (TW); Zi-Ping Wu, New Taipei City (TW); Chun-Wei Lin, New Taipei City (TW); Ting-Yu Pai, New Taipei City (TW)

(73) Assignee: WIWYNN CORPORATION, New Taipei City (TW)

( * ) Notice: Subject to any disclaimer, the term of this patent is extended or adjusted under 35 U.S.C. 154(b) by 195 days.

(21) Appl. No.: 18/344,078

(22) Filed: Jun. 29, 2023

(65) Prior Publication Data

US 2024/0015926 A1 Jan. 11, 2024

(30) Foreign Application Priority Data

Jul. 8, 2022 (TW) .................................. 111125827

(51) Int. Cl.
H05K 7/20 (2006.01)
(52) U.S. Cl.
CPC ......... H05K 7/203 (2013.01); H05K 7/20809 (2013.01)
(58) Field of Classification Search
CPC ...................................................... H05K 7/203
See application file for complete search history.

(56) References Cited

U.S. PATENT DOCUMENTS

| 4,704,658 A | * | 11/1987 | Yokouchi | ............... | H05K 7/203 |
| | | | | | 361/698 |
| 10,130,008 B2 | * | 11/2018 | Shepard | ............. | H05K 7/20236 |
| 12,051,637 B1 | * | 7/2024 | Gregory | ................. | H01L 23/02 |
| 12,238,892 B2 | * | 2/2025 | Sover | ..................... | H05K 7/203 |
| 12,293,956 B2 | * | 5/2025 | Yang | ...................... | H01L 23/44 |
| 2021/0327787 A1 | * | 10/2021 | Yang | ................... | H01L 23/3735 |
| 2023/0137684 A1 | * | 5/2023 | Yang | ................... | H01L 23/3736 |
| | | | | | 257/715 |

(Continued)

FOREIGN PATENT DOCUMENTS

| CN | 109843025 A | 6/2019 |
| CN | 111629566 A | 9/2020 |

(Continued)

OTHER PUBLICATIONS

Examination report dated Sep. 28, 2023, listed in related Taiwan patent application No. 111125829.

(Continued)

*Primary Examiner* — Robert J Hoffberg
(74) *Attorney, Agent, or Firm* — McClure, Qualey & Rodack, LLP

(57) ABSTRACT

An immersion cooling system includes a cooling tank, an immersion unit, a first disturbing element, and a first maintaining element. The cooling tank has a receiving portion. The immersion unit is in the receiving portion, and the immersion unit includes a boiler plate. The first disturbing element has a first convex surface. The first maintaining element maintains the first disturbing element to allow a convex direction of the first convex surface towards the boiler plate, and a first predetermined distance is between the first convex surface and the boiler plate.

22 Claims, 23 Drawing Sheets

(56)                     References Cited

U.S. PATENT DOCUMENTS

| 2023/0232583 | A1 * | 7/2023 | Manousakis | ....... H05K 7/20318 |
| | | | | 361/679.47 |
| 2024/0015929 | A1 * | 1/2024 | Tu | ....................... H05K 7/20809 |
| 2024/0015930 | A1 * | 1/2024 | Tu | ....................... H05K 7/20318 |
| 2025/0024639 | A1 * | 1/2025 | Lau | ..................... H05K 7/20327 |
| 2025/0240922 | A1 * | 7/2025 | Chien | ............... H05K 7/20327 |

FOREIGN PATENT DOCUMENTS

| CN | 213694613 U | 7/2021 |
| CN | 216532287 U | 5/2022 |
| JP | 3964193 B2 | 8/2007 |
| WO | 2021231768 A1 | 11/2021 |

OTHER PUBLICATIONS

Examination report dated Jul. 12, 2023, listed in related Taiwan patent application No. 111125829.

Examination report dated Dec. 13, 2022, listed in related Taiwan patent application No. 111125827.

Examination report dated Mar. 17, 2026, listed in related China patent application No. 202310333336.9.

* cited by examiner

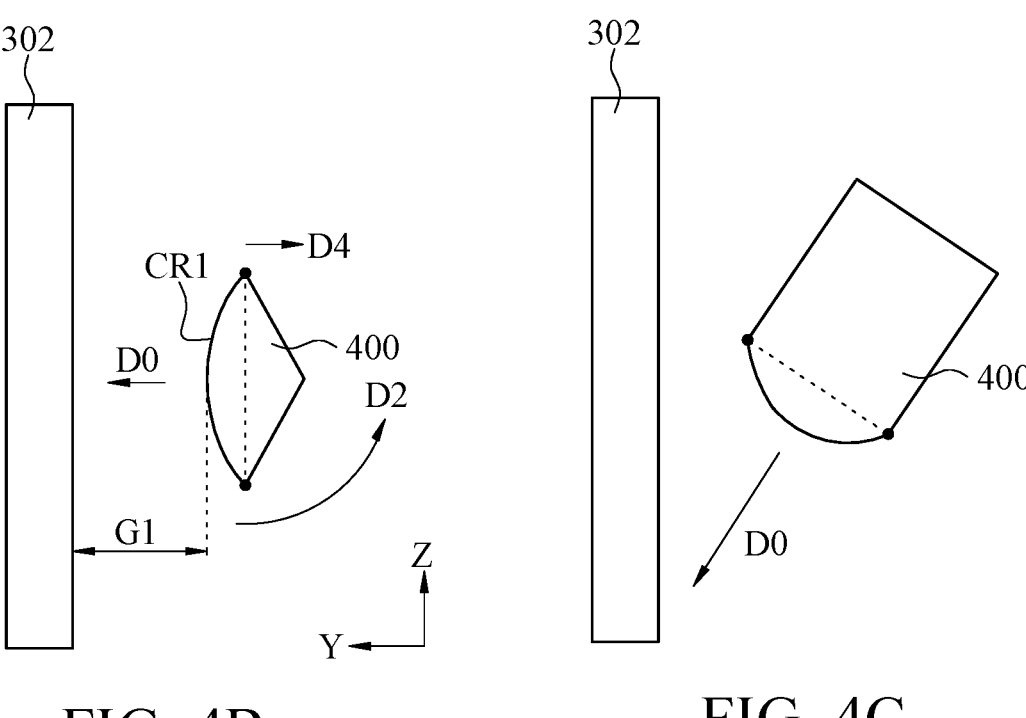
FIG. 4B
FIG. 4C
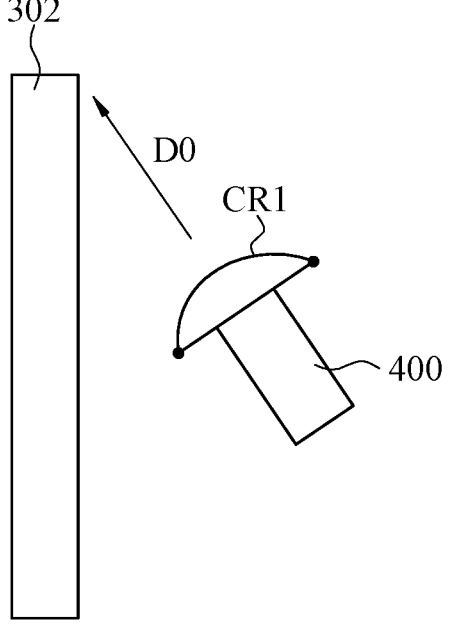
FIG. 4D
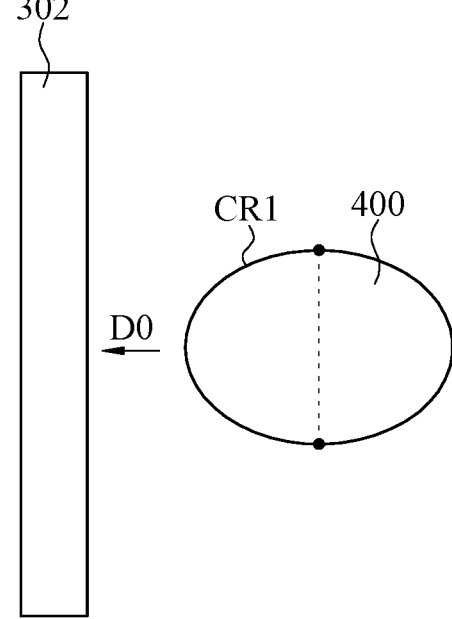
FIG. 4E

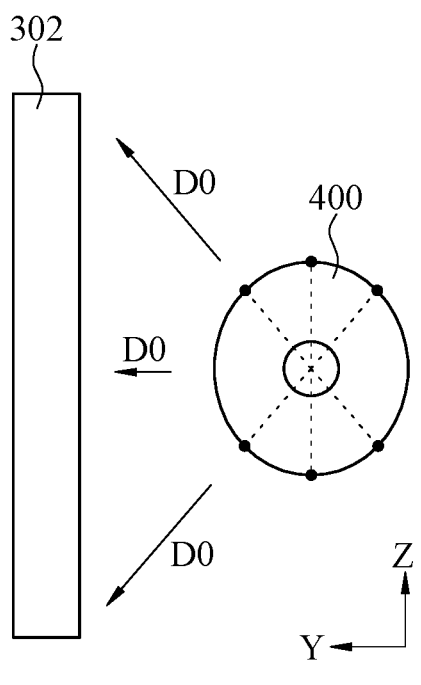
FIG. 5D
FIG. 5E
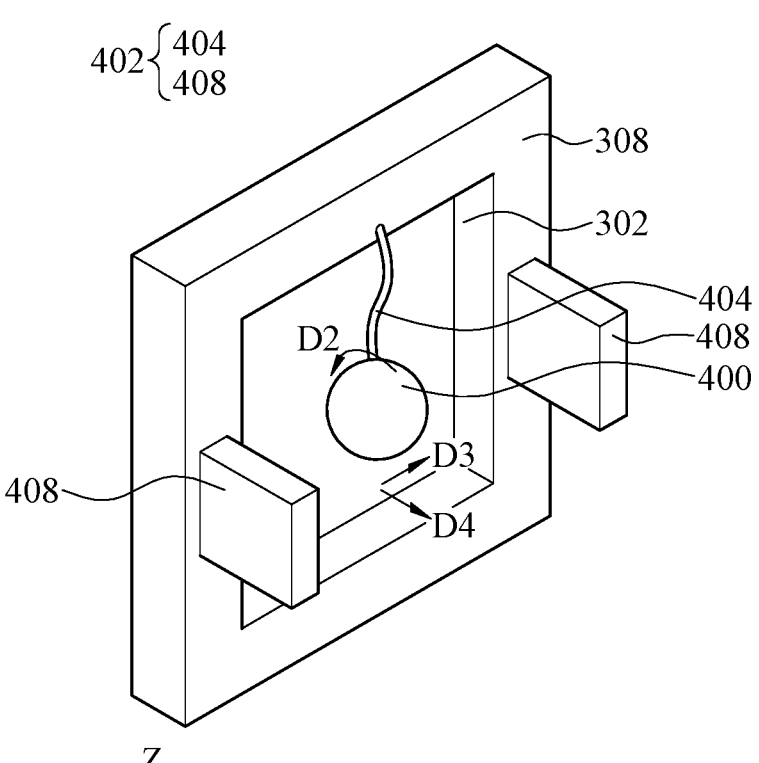
FIG. 6A
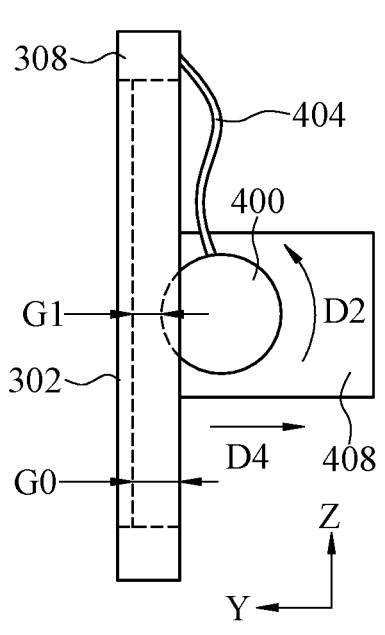
FIG. 6B

IMMERSION COOLING SYSTEM

CROSS-REFERENCE TO RELATED APPLICATION

This non-provisional application claims priority under 35 U.S.C. § 119(a) to Patent Application No. 111125827 filed in Taiwan, R.O.C. on Jul. 8, 2022, and the entire contents of which are hereby incorporated by reference.

BACKGROUND

Technical Field

The instant disclosure relates to an immersion cooling system, particularly an immersion cooling system having a disturbing element.

Related Art

An immersion cooling system usually refers to a system capable of transmitting the heat generated by an electronic device to a heat transfer fluid by submerging the electronic device in a heat transfer fluid; therefore, the temperature of the electronic device can be reduced. Hence, the working temperature of the electronic device can be maintained within a proper range to reach desired working performance and service life of the electronic device.

In the process of transferring the heats from the electronic device to the heat transfer fluid, the heat transfer fluid with a lower boiling point will be first boiled and vaporized, and thus bubbles in a large amount will be quickly generated at interfaces (as well as the proximity of the interfaces) between the electronic device and the heat transfer fluid. These bubbles will be widely dispersed in the heat transfer fluid.

SUMMARY

In view of this, according to some embodiments, an immersion cooling system is provided and comprises a cooling tank, an immersion unit, a first disturbing element, and a first maintaining element. The cooling tank has a receiving portion. The immersion unit is in the receiving portion and the immersion unit comprises a boiler plate. The first disturbing element has a first convex surface. The first maintaining element maintains the first disturbing element to allow a convex direction of the first convex surface towards the boiler plate. A first predetermined distance is between the first convex surface and the boiler plate.

According to some embodiments, the immersion unit comprises a bracket. The boiler plate is in the bracket. The first maintaining element comprises two first maintaining strings. One of two ends of each of the first maintaining strings is maintained at the first disturbing element, and the other end of each of the first maintaining strings is maintained at the bracket to allow the convex direction of the first convex surface towards the boiler plate.

According to some embodiments, the immersion unit comprises a bracket. The boiler plate is in the bracket. The first maintaining element comprises a first maintaining string. Two ends of the first maintaining string are maintained at the bracket, and the first maintaining string passes through the first disturbing element.

According to some embodiments, the immersion unit comprises a bracket. The boiler plate is in the bracket. The first maintaining element comprises a first maintaining string. One of two ends of the first maintaining string is maintained at the bracket, and the other end of the first maintaining string is maintained at the first disturbing element.

According to some embodiments, the immersion cooling system further comprises a heat transfer fluid. The heat transfer fluid is received in the receiving portion and at least submerges the boiler plate. A specific gravity of the first disturbing element is substantially equal to a specific gravity of the heat transfer fluid. In some embodiments, the first maintaining string is maintained at an upper side or a lower side of the bracket.

According to some embodiments, the first maintaining element further comprises a resilient element with elasticity. The resilient element is between the first disturbing element and the first maintaining element.

According to some embodiments, the first maintaining element further comprises a resilient element, and both the first disturbing element and the resilient element are magnetic. The resilient element is between the first disturbing element and the first maintaining element.

According to some embodiments, the immersion unit further comprises a main body frame and an electronic device. The electronic device is in the main body frame and the electronic device comprises a heating element contacting the boiler plate.

According to some embodiments, the boiler plate faces a surface of the heat transfer fluid. According to some other embodiments, a main surface of the boiler plate is substantially parallel to a vertical line.

According to some embodiments, the immersion cooling system further comprises a plurality of the cooling tanks, a plurality of immersion units, a plurality of the first disturbing elements, and a plurality of the first maintaining elements, wherein each of the cooling tanks corresponds to a corresponding one of the immersion units, a corresponding one of the first disturbing elements, and a corresponding one of the first maintaining elements.

To sum up, according to some embodiments, an immersion cooling system having at least one disturbing element is provided. Each of the disturbing elements has a convex surface, and a convex direction of the convex surface faces a boiler plate with a predetermined distance between the convex surface and the boiler plate. In some embodiments, when the boiler plate in operation is submerged in the heat transfer fluid, a large number of bubbles generated in the heat transfer fluid will be disturbed by the disturbing element to further change (even to accelerate) the flow of the bubbles. Hence, according to some embodiments, through the disturbing elements, the bubbles can be prevented from staying in place or flowing to other locations in the heat transfer fluid. In addition, according to some embodiments, through improving conditions of the bubbles (such as staying in place or flowing to other locations), pollutants generated at the surface of the boiler plate (or the proximity of the boiler plate) can be also removed at the same time, so that the pollutants that would further affect the cooling performance of the boiler plate can be prevented from being accumulated at the surface of the boiler plate (or the proximity of the boiler plate).

BRIEF DESCRIPTION OF THE DRAWINGS

FIG. 4B illustrates a schematic view in the second view (i.e., the YZ plane) according to a first embodiment of a partial section B shown in FIG. 4A;

FIG. 4C illustrates a schematic view in the second view (i.e., the YZ plane) according to a second embodiment of the partial section B shown in FIG. 4A;

FIG. 4D illustrates a schematic view in the second view (i.e., the YZ plane) according to a third embodiment of the partial section B shown in FIG. 4A;

FIG. 4E illustrates a schematic view in the second view (i.e., the YZ plane) according to a fourth embodiment of the partial section B shown in FIG. 4A;

FIG. 5D illustrates a schematic view in the second view (i.e., the YZ plane) according to a third embodiment of a single immersion unit of the immersion cooling system shown in FIG.

FIG. 5E illustrates a schematic view in the second view (i.e., the YZ plane) according to a fourth embodiment of a single immersion unit of the immersion cooling system shown in FIG.

FIG. 6A illustrates a schematic perspective view according to a third embodiment of a partial section A shown in FIG. 1A;

FIG. 6B illustrates a schematic view in the second view (i.e., the YZ plane) of an embodiment of a single immersion unit of the immersion cooling system shown in FIG. 6A;

DETAILED DESCRIPTION

Figure 1A:
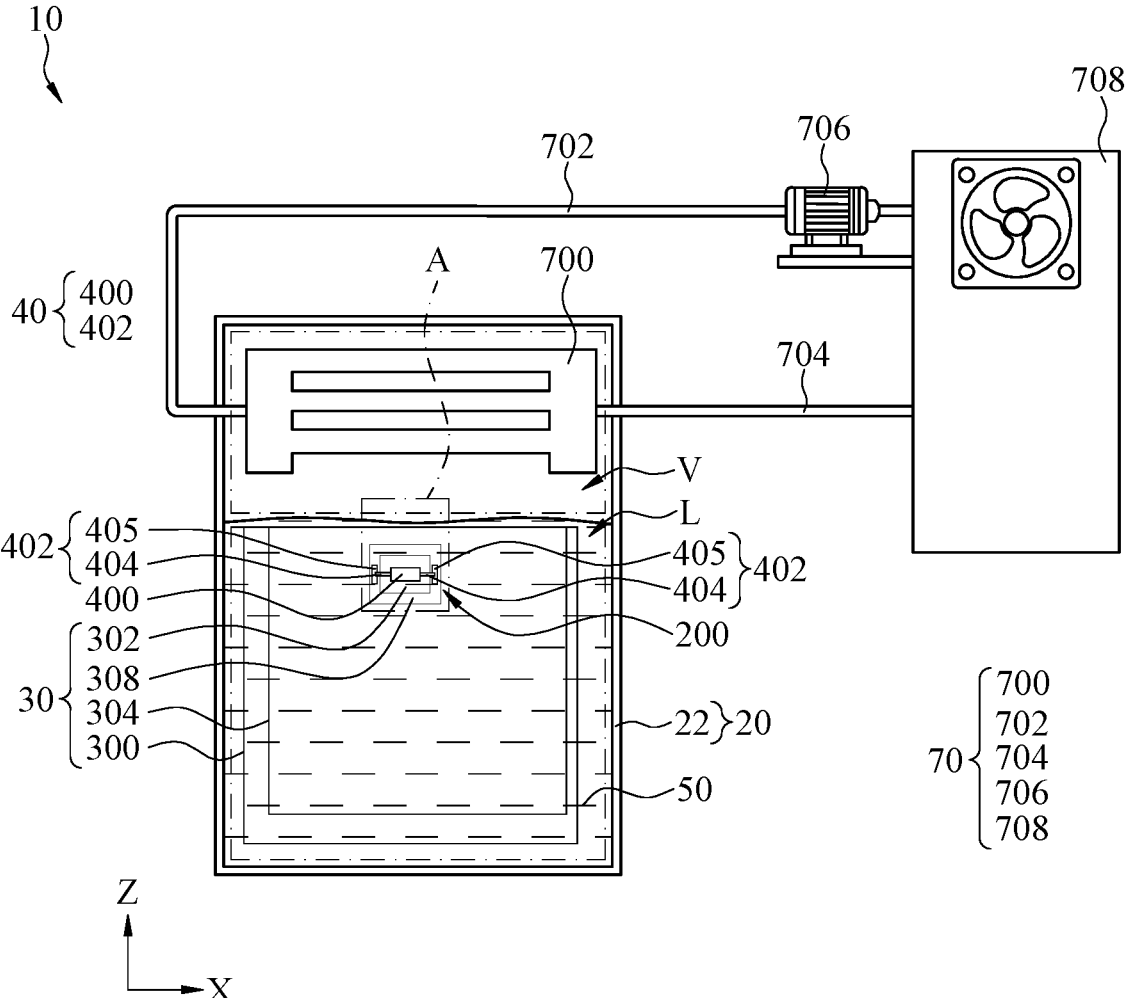
FIG. 1A illustrates a schematic structural view of an immersion cooling system according to some embodiments.

Please refer to FIG. 1A. FIG. 1A illustrates a schematic structural view of an immersion cooling system 10 according to some embodiments. The immersion cooling system 10 comprises a cooling tank 20, an immersion unit 30, and a disturbing unit 40 (the disturbing unit 40 comprises at least one disturbing element (e.g., a first disturbing element 400) and at least one maintaining element (e.g., a first maintaining element 402)). The cooling tank 20 has a receiving portion 200. The immersion unit 30 is in the receiving portion 200, and the immersion unit 30 comprises a boiler plate 302. The first disturbing element 400 has a first convex surface CR1 with a convex direction D0 (which is shown in FIG. 4B and will be described later). The first maintaining element 402 maintains the first disturbing element 400 to allow the convex direction D0 of the first convex surface CR1 normally towards the boiler plate 302 (which will be described later). A first predetermined distance G1 is between the first convex surface CR1 and the boiler plate 302 (which is shown in FIG. 4B and will be described later).

The term "maintain/maintaining" refers to that the first maintaining element 402 is connected to the first disturbing element 400 through, for example, latching, bonding, or integral molding to restrict the first disturbing element 400 at a permissible space or locations; meanwhile, the first disturbing element 400 can be further restricted or not restricted by the first maintaining element 402 to move and/or rotate along at least one direction. The term "face/facing" refers to that a virtual line is drawn along the convex direction D0 of the first convex surface CR1, and the virtual line may fall within the boundaries of the boiler plate 302 (which will be described later). The term "normally face/facing" refers to that the virtual line can permanently or non-permanently fall within the boundaries of the boiler plate 302 (which will be described later). For example, in the case that the virtual line non-permanently falls within the boundaries of the boiler plate 302, the first maintaining element 402 is rotatably configured at the proximity of the boiler plate 302; and in the case that the convex direction D0 is not within the boundaries of the boiler plate 302, through the first maintaining element 402, the convex direction D0 will be quickly forced back to a direction within the boundaries of the boiler plate 302. Since the space where the disturbing element is configured would be obstructed by the configuration of the disturbing element (e.g., the first disturbing element 400), the fluid (such as various gases or liquids, or such as the heat transfer fluid 50, which will be described later) that flows in the proximity of the disturbing element will be further disturbed.

Figure 1B:
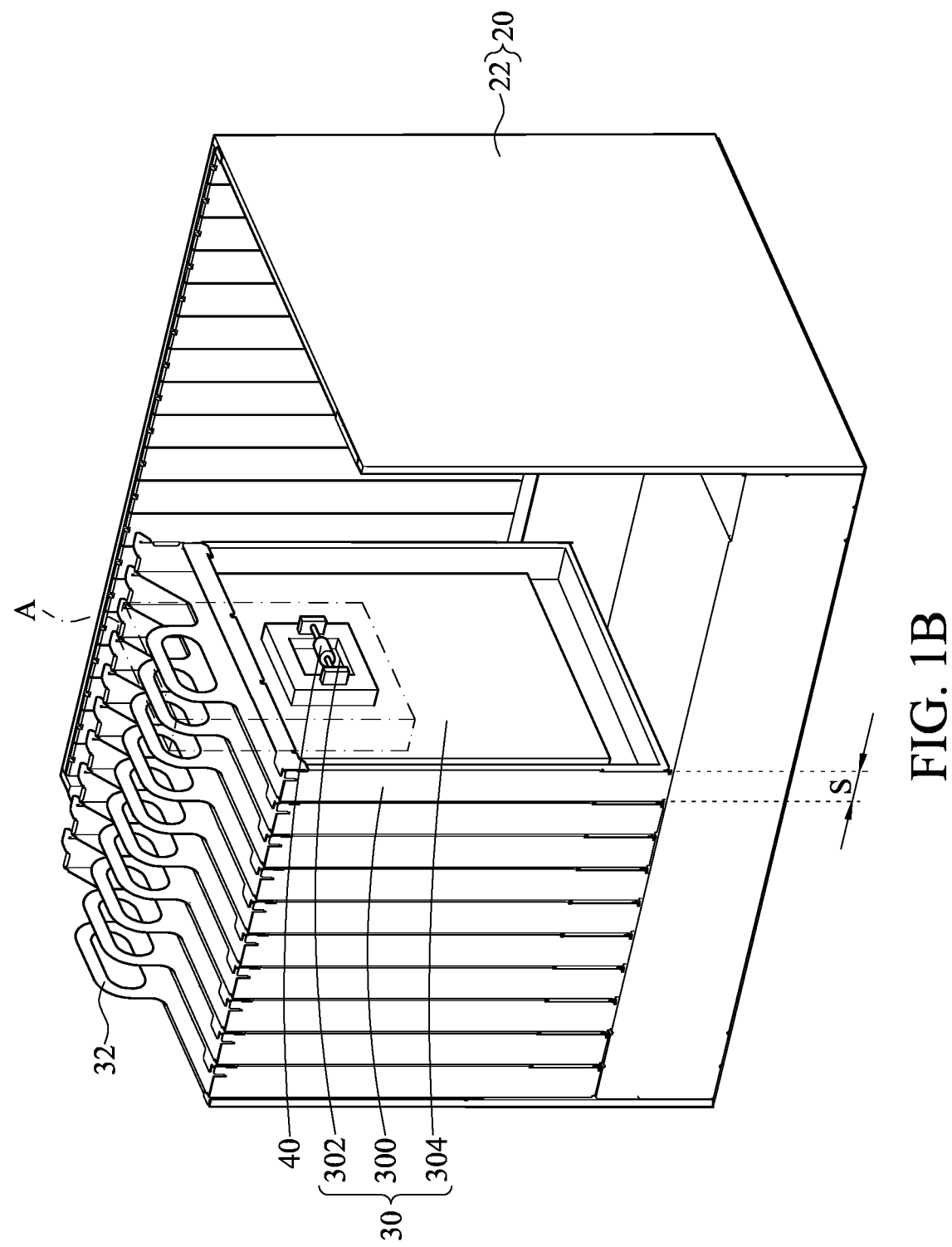
FIG. 1B illustrates a partial schematic perspective view of an immersion cooling system applied to a cabinet-mounted server system according to some embodiments.

Please refer to FIG. 1B. FIG. 1B illustrates a partial schematic perspective view of an immersion cooling system 10 applied to a cabinet-mounted server system according to some embodiments. Only a partial structure for receiving the lower part of a cabinet 22 of the immersion unit 30 shown in FIG. 1A is shown in FIG. 1B (it is noted that, for ease of understanding, a front plate at the lower part of the cabinet 22 is removed from the figure). The immersion cooling system 10 may be equipped with a single immersion unit 30 or a plurality of immersion units 30. The single immersion unit 30 may be, but not limited to, a rack-mounted server unit. The immersion cooling system 10 may be also equipped with a plurality of the immersion units 30 according to some embodiments, and the immersion cooling system 10 may be, but not limited to, a cabinet-mounted server system shown in FIG. 1B. The cabinet-mounted server system comprises a cabinet 22 which receives a plurality of immersion units 30, and each of the immersion units 30 is a rack-mounted server unit with a width. The width of each of the rack-mounted server units may be identical or different from each other; for example, the width of each of the rack-mounted server units may be 48.26 cm (i.e., 19 inch). The thickness S (as shown in FIG. 1B) of each of the rack-mounted server units may be adjusted according to different specifications of the server; for example, the thickness S may be a multiple of 4.445 cm; that is, the thickness S may be, but not limited to, 1U (i.e., 4.445 cm), 2U (i.e., 2*4.445 cm; 8.89 cm), 3U (i.e., 3*4.445 cm; 13.335 cm), or 4U (i.e., 4*4.445 cm; 17.78 cm). Therefore, the immersion units 30 or the cooling tank 20 where the immersion units 30 are received can serve as a system-level device (such as a server) with various thickness S, or a system-assembly-level device (such as a server assembly).

Figure 4A:
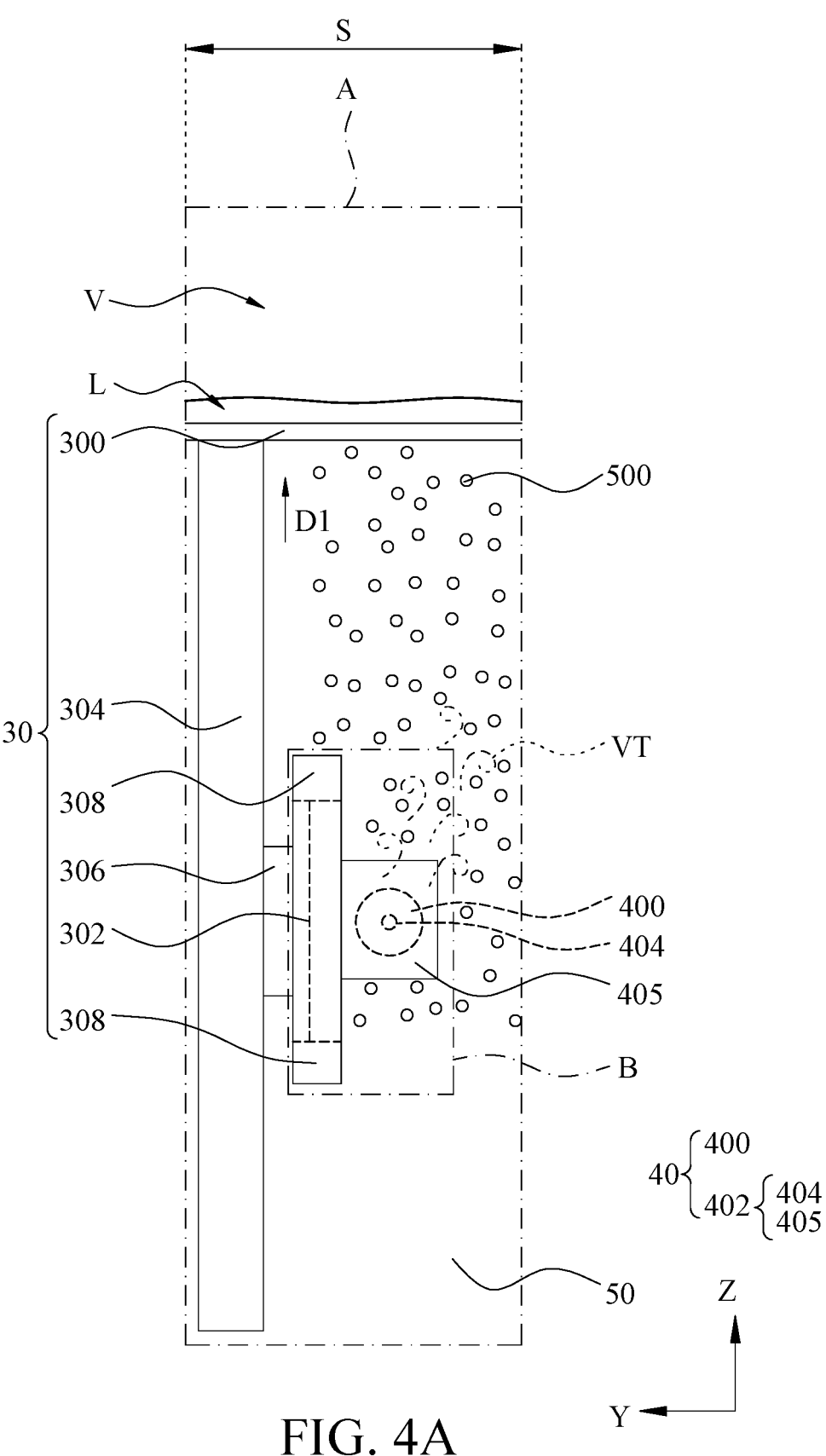
FIG. 4A illustrates a schematic working view in a second view (i.e., the YZ plane) of a single immersion unit of the immersion cooling system shown in FIG. 2.

The immersion units 30 serving as rack-mounted server units according to some embodiments are described below as an exemplified illustration. Each of the immersion units 30 comprises a main body frame 300 and an electronic device 304. The main body frame 300 is for fixing the electronic device 304. The electronic device 304 may be, but not limited to, devices such as a printed circuit board (i.e., PCB), a mother board, a server, or the like. The dimension of the main body frame 300 may be, for example, complied with the dimensions of 1 U, 2 U, 3 U, or 4 U. The electronic device 304 comprises a heating element 306 (which is shown in FIG. 4A and will be described later), and the boiler plate 302 contacts the heating element 306. The heating element 306 may be, but not limited to, a chip, and the chip may be, but not limited to, a CPU or a display chip (i.e., a graphics processing unit, GPU). When the electronic device 304 is in operation, the heats generated by the heating element 306 would be conducted to the boiler plate 302. In some embodiments, as shown in FIG. 1B, each of the immersion units 30 further comprises a body handle 32. The body handle 32 is on one side of the main body frame 300, and the side is away from the lower portion of the main body frame 300. Hence, in some embodiments, through the body handle 32, the rack-mounted immersion units 30 can be taken out from, for example, the cabinet 22 or the cooling tank 20. Alternatively, in some embodiments, the immersion unit 30 can be received in, for example, the cabinet 22 or the cooling tank 20 conveniently. To illustrate each of the embodiments more clearly, in the instant disclosure, the body handle 32 is omitted and not shown in black line in the figures other than FIG. 1B.

Figure 2:
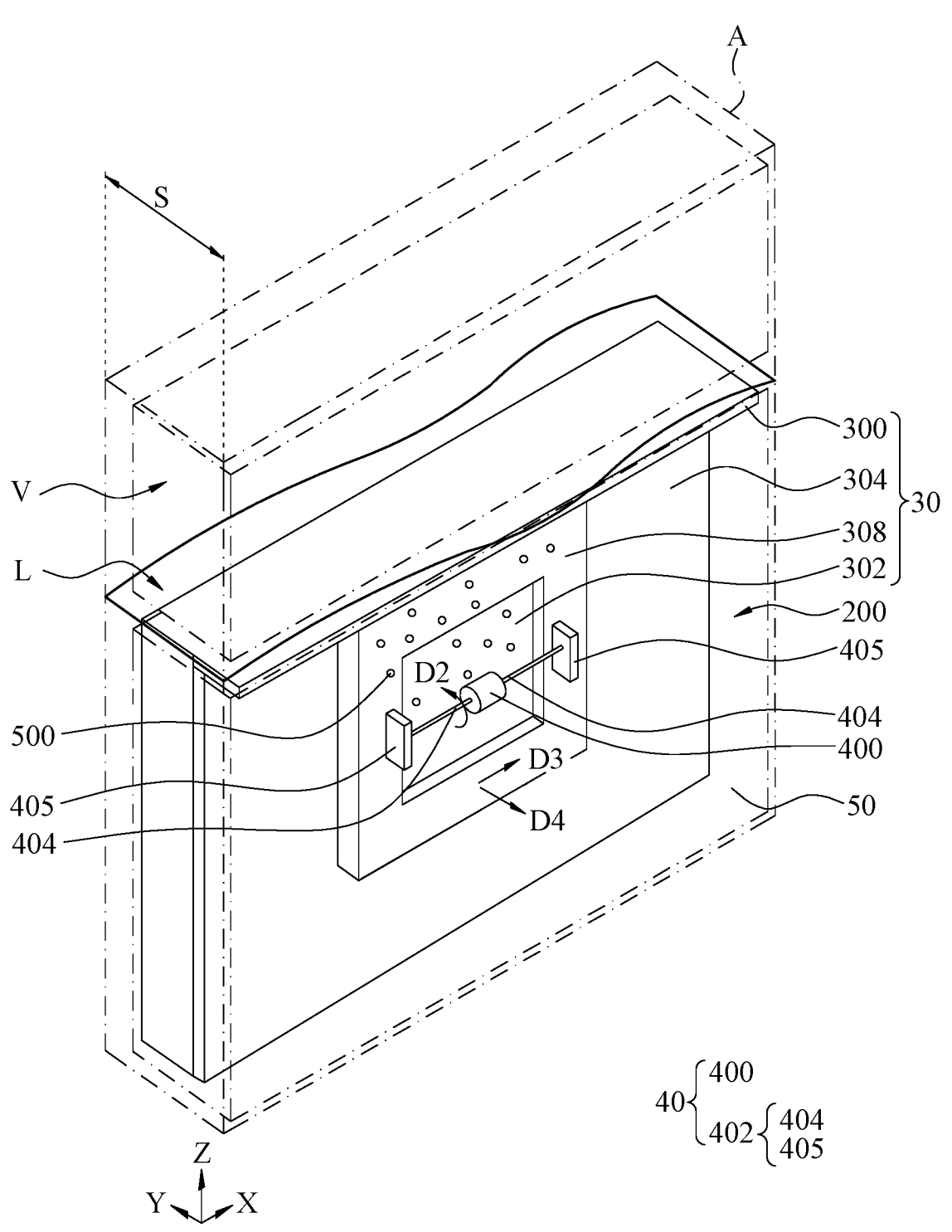
FIG. 2 illustrates a schematic perspective and working view according to a first embodiment of a partial section A shown in FIG. 1A.

Please refer to FIG. 2. FIG. 2 illustrates a schematic perspective and working view according to a first embodiment of a partial section A shown in FIG. 1A. In operation, the heat transfer fluid 50 can be received in the receiving portion 200 and at least submerge the boiler plate 302. Hence, the receiving portion 200 comprises a gas-phase space V and a liquid-phase space L. That is, in this embodiment, the liquid-phase space L is a space where the heat transfer fluid 50 is received in the receiving portion 200. When the boiler plate 302 physically contacts the heat transfer fluid 50, the heats of the boiler plate 302 can be conducted to the heat transfer fluid 50. The heat transfer fluid 50 is a non-conductive fluid with a boiling point being less than or equal to a working temperature of the boiler plate 302. Therefore, the critical boiling point of the heat transfer fluid 50 would be quickly reached by absorbing the heats to further vaporize the heat transfer fluid 50, so that a large number of bubbles 500 would be generated. Next, when the bubbles 500 contact the disturbing element (e.g., the first disturbing element 400), the bubbles 500 would move along the convex surface (e.g., the first convex surface CR1, as shown in FIG. 4B) of the disturbing element to be further guided to locations away from the convex surface (e.g., the top right of the first disturbing element 400, as shown in FIG. 4A). Therefore, vortexes (as denoted as VT in FIG. 4A) with converging effects would be formed at the locations (i.e., locations away from the boiler plate 302). Hence, through the disturbing element, the bubbles 500 would be guided to the locations away from the proximity of the boiler plate 302. The bubbles 500 would generally flow along the +Z direction as shown in FIG. 2 and be further vaporized and move to the gas-phase space V. Therefore, in some embodiments, the bubbles 500 in a large amount can be prevented from being attached to or accumulated at the proximity of the boiler plate 302 of the immersion cooling system 10. Therefore, in some embodiments, the overall cooling performance of the immersion cooling system 10 can also be prevented from being affected by the reduced contact possibilities between the boiler plate 302 and the liquid-phase heat transfer fluid 50.

In some embodiments, the boiler plate 302 has a main surface. The main surface is a surface contacting the heat transfer fluid 50 and substantially parallel to a vertical line (e.g., the Z direction as shown in FIG. 2). Hence, the boiler plate 302 can be extendingly configured along a direction (for example, the Z direction as shown in FIG. 2) that is substantially perpendicular to the surface of the heat transfer fluid 50. Alternatively, in some embodiments, the boiler plate 302 can be extendingly configured along a plane (e.g., the XZ plane as shown in FIG. 2) that is substantially perpendicular to the surface of the heat transfer fluid 50. Therefore, the inner space of the immersion unit 30 can be utilized more sufficiently. Furthermore, in some embodiments, in the limited inner space of the immersion unit 30, more of the immersion units 30 can be meanwhile configured along a direction (e.g., the Z direction as shown in FIG. 2) that is substantially perpendicular to the surface of the heat transfer fluid 50. Alternatively, more of the immersion units 30 can be meanwhile configured along a plane (e.g., the XZ plane as shown in FIG. 2) that is substantially perpendicular to the surface of the heat transfer fluid 50. Hence, a plenty of the immersion units 30 and the boiler plates 302 corresponding thereto can be cooled synchronously and more efficiently.

In some embodiments, the immersion cooling system 10 further comprises a condensation device 70 (as shown in FIG. 1). The condensation device 70 comprises a condenser 700, a condensation pump 706, and a heat exchanger 708. The condenser 700 is above the surface of the heat transfer fluid 50. Referring to FIG. 1A, the condenser 700 is in the gas-phase space V of the receiving portion 200. Through a first condensation pipe 702 and a second condensation pipe 704, the condensation pump 706 allows a heat exchange fluid to be circulated between the heat exchanger 708 and the condenser 700. The heat exchange fluid may be, but not limited to, water. When the immersion cooling system 10 is in operation, the gas-phase heat transfer fluid 50 escaping to the gas-phase space V would contact the surface of the condenser 700. Since the surface temperature of the condenser 700 is lower than the temperature of the heat transfer fluid 50, the heats would be transferred from the gas-phase heat transfer fluid 50 to the condenser 700. The gas-phase heat transfer fluid 50 would be then condensed into the liquid-phase heat transfer fluid 50 after the temperature of the gas-phase heat transfer fluid 50 is reduced. The liquid-phase heat transfer fluid 50 would then drop back to the heat transfer fluid 50 received in the liquid-phase space L. After the condenser 700 absorbs the heats of the gas-phase heat transfer fluid 50, the heats would be further guided to the heat exchanger 708 by the heat exchange fluid. Then, after the temperature of the heat exchange fluid is reduced, the heat exchange fluid would be guided back to the condenser 700.

Please refer to FIG. 2 and FIG. 4A at the same time. FIG. 4A illustrates a schematic working view in a second view (i.e., the YZ plane) of a single immersion unit 30 of the immersion cooling system 10 shown in FIG. 2. In FIG. 4A, the electronic device 304 is fixed to the main body frame 300, and the heating element 306 of the electronic device 304 contacts the boiler plate 302. In some embodiments, the immersion unit 30 further comprises a bracket 308 fixed to the boiler plate 302, and the boiler plate 302 is maintained by the bracket 308 to normally contact the heating element 306. The bracket 308 may be fixed to the electronic device 304, the main body frame 300, or a combination of the electronic device 304 and the main body frame 300. In some embodiments, the material of the bracket 308 may be, but not limited to, Bakelite, metal, plastic, or combinations comprising any two or more thereof.

Figure 3:
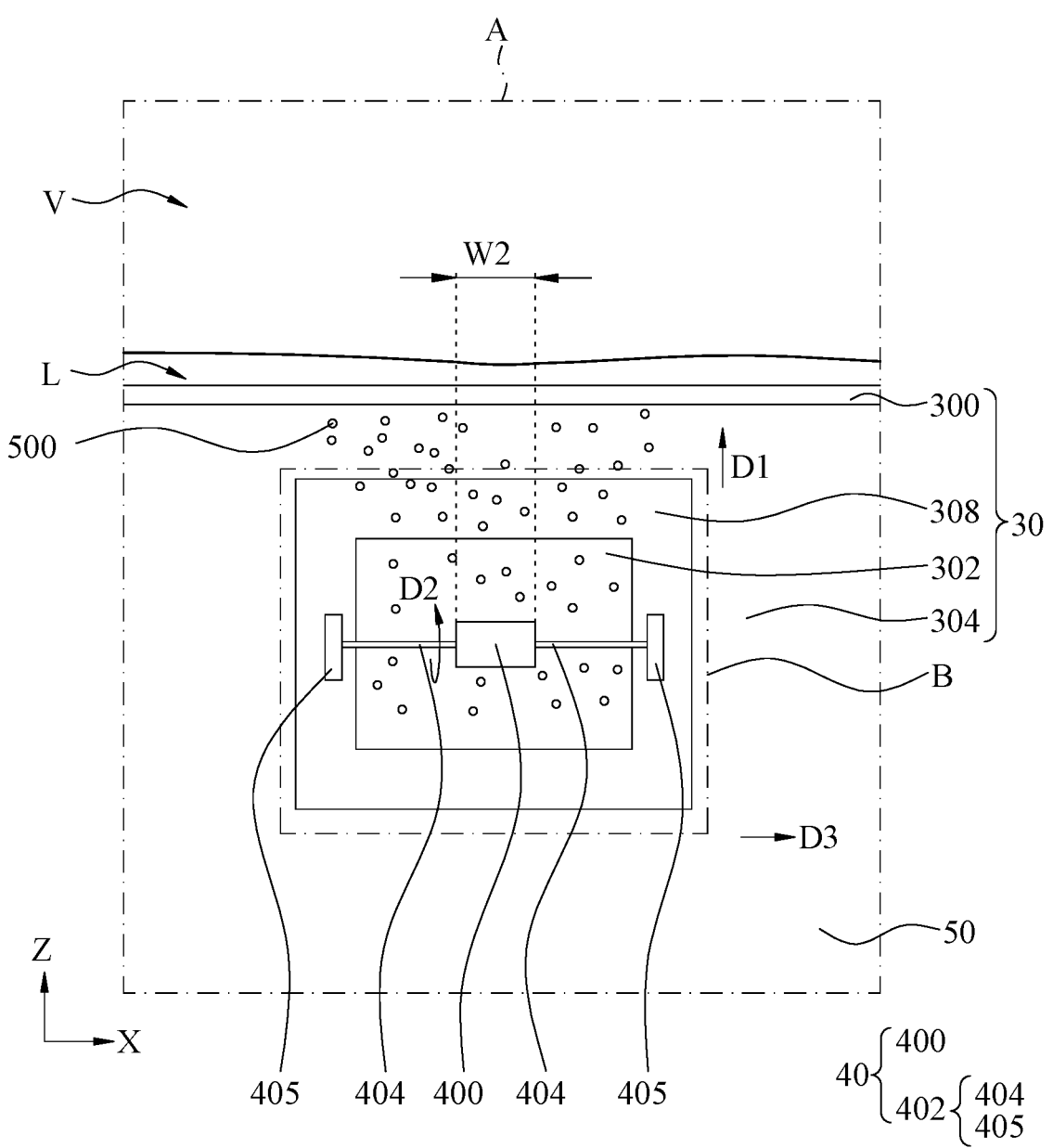
FIG. 3 illustrates a schematic working view in a first view (i.e., the XZ plane) of a single immersion unit of the immersion cooling system shown in FIG. 2.

Please refer to FIG. 2 and FIG. 3. FIG. 3 illustrates a schematic working view in a first view (i.e., the XZ plane) of a single immersion unit 30 of the immersion cooling system 10 shown in FIG. 2 (to illustrate each of the embodiments more clearly, in the instant disclosure, the heat transfer fluid 50 is only illustrated in FIG. 1A and by dotted lines, and the illustration of the heat transfer fluid 50 is further omitted in the figures other than FIG. 1A). In some embodiments, the first maintaining element 402 comprises two first maintaining strings 404. One of two ends of each of the first maintaining strings 404 is connected to the first disturbing element 400, and the other end of each of the first maintaining strings 404 is connected to the bracket 308 to allow the convex direction D0 of the first convex surface CR1 towards the boiler plate 302. The term "connect/connected" may be, but not limited to, slidably connected, detachably or permanently fixed, or directly or indirectly connected. Materials of the two first maintaining strings 404 may be identical or different from each other, and the material of each of the two first maintaining strings 404 may be, but not limited to, Bakelite, metal, plastic, or combinations comprising any two or more thereof. In some embodiments, the material of the first maintaining string 404 is an elastic material capable of accumulating elastic potential energy and generating a resilient force, such as rubber, spring, or elastic string. Hence, through the elastic first maintaining strings 404, even though the first disturbing element 400 and the first maintaining strings 404 impacted by the bubbles 500 in a large amount would be forced to slightly move away from the boiler plate 302 along a fourth direction D4 (e.g., the −Y direction shown in FIG. 2), the first maintaining strings 404 with elasticity would still force the first disturbing element 400 to quickly return to the original place resiliently along a direction opposite to the fourth direction D4 (e.g., the +Y direction shown in FIG. 2). Therefore, the first disturbing element 400 can be maintained within a specific space or location which is relatively adjacent to the boiler plate 302 so as to maintain the performance of the first disturbing element 400 for disturbing the bubbles 500. In addition, through the elastic first maintaining strings 404, even though the first disturbing element 400 and the first maintaining strings 404 impacted by the bubbles 500 in a large amount would be slightly forced to move away from the boiler plate 302 along a third direction D3 (for example, the +X direction shown in FIG. 2), the first maintaining strings 404 with elasticity would still force the first disturbing element 400 to quickly move back to the original place resiliently along a direction opposite to the fourth direction D3 (for example, the −X direction shown in FIG. 2). Therefore, the first disturbing element 400 can be maintained within a specific space or location between two ends of the boiler plate 302 which is relatively adjacent to the boiler plate 302. Hence, the performance of the first disturbing element 400 for disturbing the bubbles 500 can be maintained.

In FIG. 2 and FIG. 3, in some embodiments, the first maintaining element 402 further comprises one or more first supporting seats 405 respectively on the bracket 308. Each of the first supporting seats 405 corresponds to a corresponding one of the first maintaining strings 404. Therefore, each of the first maintaining strings 404 can be detachably or permanently fixed to the bracket 308. The material of the first supporting seat 405 may be, but not limited to, Bakelite, metal, plastic, or combinations comprising any two or more thereof.

Please refer to FIG. 4A to FIG. 4H. FIG. 4B to FIG. 4H respectively illustrate schematic views in the second view (i.e., the YZ plane) according to a first embodiment to a seventh embodiment of a partial section B shown in FIG. 4A (to illustrate each of the embodiments more clearly, in the instant disclosure, only the first disturbing element 400 and the boiler plate 302 are shown in FIG. 4B to FIG. 4H). In FIG. 4B, the first disturbing element 400 in the second view (i.e., the YZ plane) is roughly a circular sector having a first convex surface CR1. The first convex surface CR1 generally forms an arc. A line connecting the two endpoints of the arc refers to a chord of the first convex surface CR1. The convex direction D0 refers to a direction that passes through both the chord and the midpoint of the chord and that is away from the first disturbing element 400. The convex direction D0 of the first convex surface CR1 is configured to be normally towards the boiler plate 302. A distance between the first convex surface CR1 and the boiler plate 302 is a first predetermined distance G1. The term "face/facing" refers to that a virtual line is drawn along the convex direction D0 of the first convex surface CR1, and the virtual line may fall within the boundaries of the boiler plate 302. The term "normally face/facing" refers to that the virtual line can permanently or non-permanently fall within the boundaries of the boiler plate 302. Specifically, the convex directions D0 shown in FIG. 4B to FIG. 4H are directions in a static condition. The term "static" refers to a condition that the boiler plate 302 and the first disturbing element 400 are not yet submerged by the heat transfer fluid 50. In contrast, the term "dynamic" refers to a varying condition that the boiler plate 302 and the first disturbing element 400 are submerged by the heat transfer fluid 50, and the first disturbing element 400 can still swing, sway, or rotate to be towards or not towards the boiler plate 302 through the elastic first maintaining string 404, for example.

In some embodiments, the first convex surface CR1 has a curvature radius, and the curvature radius may be, but not limited to, any value ranging between 5 mm and 10 mm. The first predetermined distance G1 may be, but not limited to, any value ranging between 20 mm and 30 mm.

In some embodiments, the first convex surface CR1 may be subjected to a surface pretreatment. For example, the first convex surface CR1 may be subjected to a surface modification and modified to be hydrophobic. Therefore, when the bubbles 500 contact the first convex surface CR1, the bubbles 500 will move along the hydrophobic first convex surface CR1 and be further guided more quickly to locations away from the first convex surface CR1. Therefore, it is advantageous for forming the vortexes VT (as shown in FIG. 4A) with converging effects at the locations (i.e., locations away from the boiler plate 302; e.g., the top right of the first disturbing element 400 shown in FIG. 4A).

For example, in FIG. 4B, the virtual line of the convex direction D0 falls within the upper and the lower boundaries of the boiler plate 302 shown in FIG. 4B. In FIG. 4C, the first disturbing element 400 in the second view (i.e., the YZ plane) is roughly a rectangle having a convex surface. The virtual line of the convex direction D0 of the first disturbing element 400 falls on the lower boundary of the boiler plate 302 shown in FIG. 4C and also falls within the boundaries of the boiler plate 302. In FIG. 4D, the first disturbing element 400 in the second view (i.e., the YZ plane) is roughly a mushroom shape. The virtual line of the convex direction D0 of the first disturbing element 400 falls on the upper boundary of the boiler plate 302 shown in FIG. 4D and also falls within the boundaries of the boiler plate 302. In some embodiments, the first disturbing element 400 can rotate between the convex directions DO shown in FIG. 4B and FIG. 4C along a second direction D2 (which may be counterclockwise or clockwise) in a reciprocating manner. Alternatively, in some embodiments, the convex directions D0 of the first disturbing element 400 can be temporarily not within the boundaries of the boiler plate 302, but then be forced to quickly return to fall within the boundaries of the boiler plate 302 resiliently along the second direction D2. Therefore, the convex directions D0 can be configured to be normally towards the boiler plate 302 (or within the boundaries of the boiler plate 302).

Figures 4F, 4G:
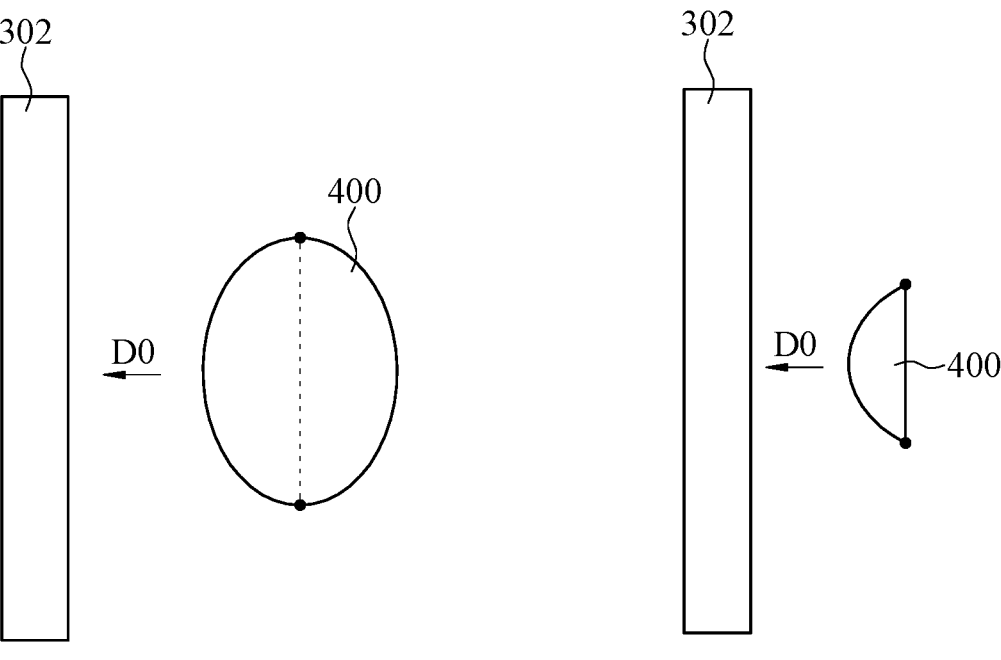
FIG. 4F illustrates a schematic view in the second view (i.e., the YZ plane) according to a fifth embodiment of the partial section B shown in FIG. 4A.
FIG. 4G illustrates a schematic view in the second view (i.e., the YZ plane) according to a sixth embodiment of the partial section B shown in FIG. 4A.
Figure 4H:
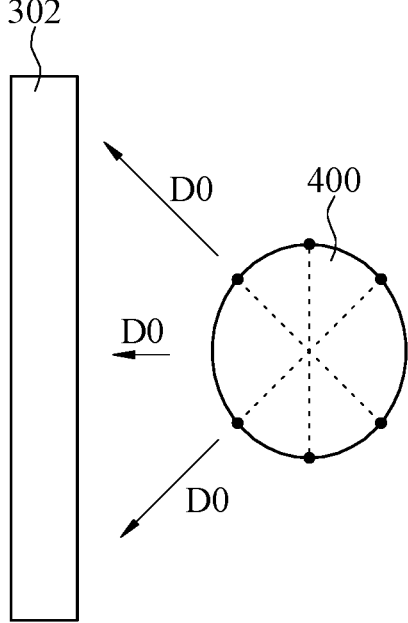
FIG. 4H illustrates a schematic view in the second view (i.e., the YZ plane) according to a seventh embodiment of the partial section B shown in FIG. 4A.

For another example, in FIG. 4E and FIG. 4F, the first disturbing element 400 in the second view (i.e., the YZ plane) is roughly an oval shape or an egg shape. The virtual line of the convex direction D0 of first disturbing element 400 falls within the boundaries of the boiler plate 302 shown in FIG. 4E and also falls within the boundaries of the boiler plate 302. Moreover, the virtual line of the convex direction D0, which rotates along the second direction D2 to the location shown in FIG. 4F, also falls within the boundaries of the boiler plate 302. Hence, in some embodiments, even though the first disturbing element 400 rotates along the second direction D2 by 360 degrees or less, the convex direction D0 of the first disturbing element 400 can still be maintained to be normally towards the boiler plate 302. Similarly, in FIG. 4H, the first disturbing element 400 in the second view (i.e., the YZ plane) is roughly a circular shape. During the rotation along the second direction D2 by 360 degrees, the virtual line of the convex direction D0 can still fall within the boundaries of the boiler plate 302. In FIG. 4G, the first disturbing element 400 according to some embodiments in the second view (i.e., the YZ plane) can be roughly a bow shape.

Figure 5A:
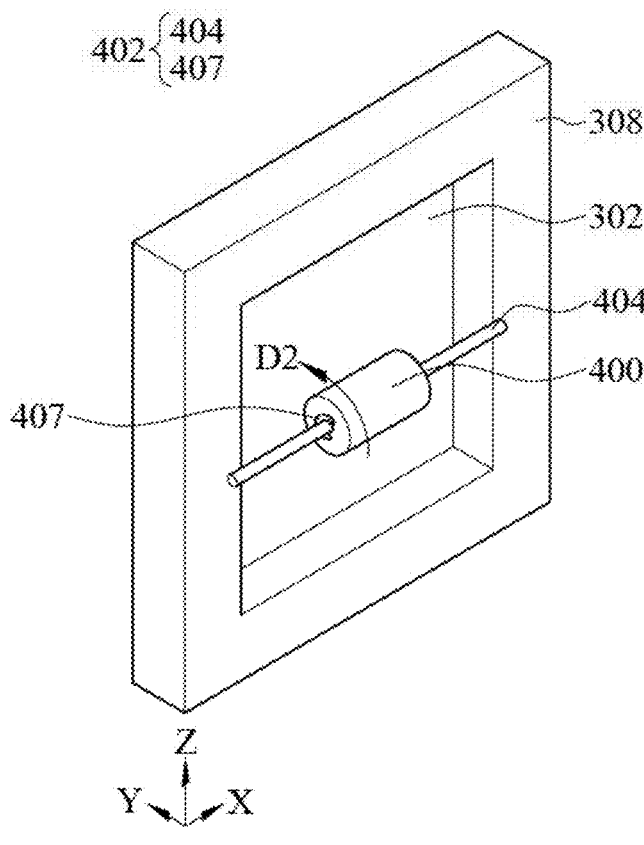
FIG. 5A illustrates a schematic perspective view according to a second embodiment of a partial section A shown in FIG. 1A.

Please refer to FIG. 5A. FIG. 5A illustrates a schematic perspective view according to a second embodiment of a partial section A shown in FIG. 1A (to illustrate each of the embodiments more clearly, in the instant disclosure, instead of showing all the elements and the bubbles 500, only some elements in the partial section A are shown in FIG. 5A). In some embodiments, the first maintaining element 402 comprises a first maintaining string 404. Two ends of the first maintaining string 404 are maintained at the bracket 308, and the first maintaining string 404 passes through the first disturbing element 400. In FIG. 5A, the two ends of the first maintaining string 404 are connected to the bracket 308 and the first maintaining string 404 passes through the first disturbing element 400. The term "connect/connected" may be, but not limited to, slidably connected, detachably or permanently fixed, or directly or indirectly connected. The material of the first maintaining string 404 may be a metal or alloy material with low ductility and high rigidity, or a material with elasticity as mentioned above, which will not be described in detail herein.

Figures 5B, 5C:
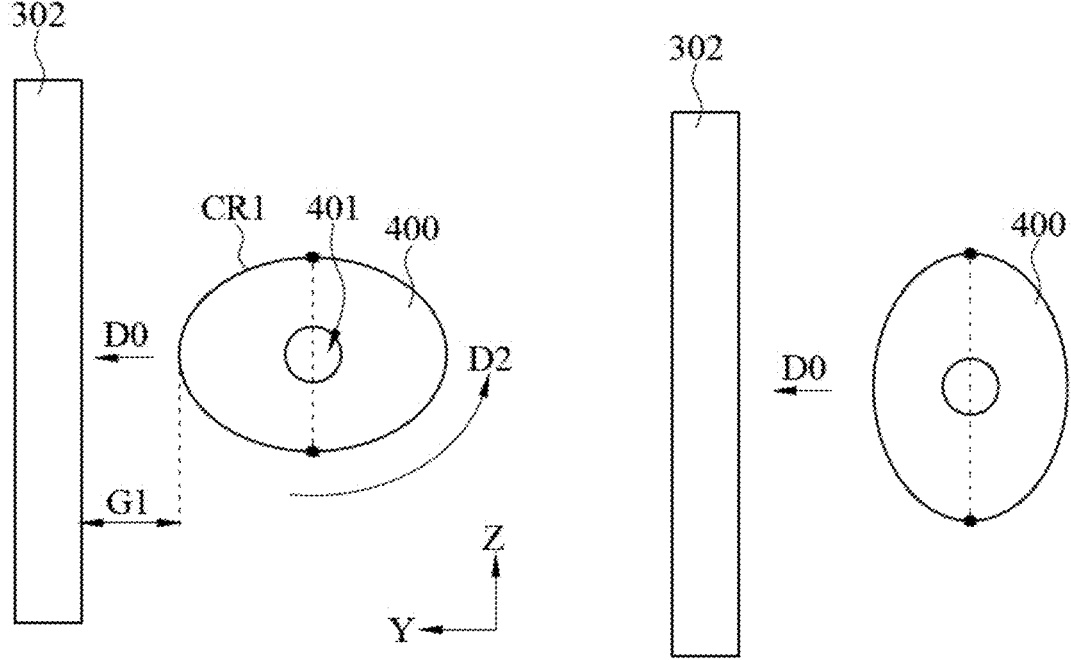
FIG. 5B illustrates a schematic view in the second view (i.e., the YZ plane) according to a first embodiment of a single immersion unit of the immersion cooling system shown in FIG.
FIG. 5C illustrates a schematic view in the second view (i.e., the YZ plane) according to a second embodiment of a single immersion unit of the immersion cooling system shown in FIG.

Please refer to FIG. 5B to FIG. 5E. FIG. 5B to FIG. 5E respectively illustrate schematic views in the second view (i.e., the YZ plane) according to a first embodiment to a seventh embodiment of a single immersion unit 30 of the immersion cooling system 10 shown in FIG. 5A (to illustrate each of the embodiments more clearly, in the instant disclosure, only the first disturbing elements 400 and the boiler plates 302 are shown in FIG. 5B to FIG. 5E). In FIG. 5B to FIG. 5C, the first disturbing element 400 in the second view (i.e., the YZ plane) is roughly an oval shape or an egg shape. The first disturbing element 400 has a through hole 401. The through hole 401 may be at any position of the first disturbing element 400; for example, at a center of the first disturbing element 400 in the second view (i.e., the YZ plane). The inner diameter of the through hole 401 is greater or slightly greater than the outer diameter of the first maintaining string 404. Therefore, the first maintaining string 404 can pass through the first disturbing element 400 by the through hole 401, and the first disturbing element 400 can be slidably configured between the two ends of the first maintaining string 404 along the third direction D3. Furthermore, in some embodiments, the first disturbing element 400 not only is slidably configured between the two ends of the first maintaining string 404 along the third direction D3, the first disturbing element 400 but also is rotatably configured between the two ends of the first maintaining string 404 along the second direction D2 (which may be counterclockwise or clockwise). Hence, in some embodiments, the first disturbing element 400 can be rotatably configured between the two ends of the first maintaining string 404 (i.e., the two ends of the boiler plate 302) in a reciprocating manner, thereby enhancing the performance of the first disturbing element 400 for disturbing the bubbles 500. For another example, in FIG. 5D, the first disturbing element 400 in the second view (i.e., the YZ plane) is roughly a circular shape with a through hole 401 (not denoted, but can be referred to in FIG. For another example, in FIG. 5E, the first disturbing element 400 in the second view (i.e., the YZ plane) is roughly a semicircular shape or a bow shape with a through hole 401 (not denoted, but can be referred to in FIG. 5B). Therefore, through the first disturbing element 400 in various shapes, the first disturbing element 400 is still capable of being rotatably configured between the two ends of the first maintaining string 404 (i.e., the two ends of the boiler plate 302) in a reciprocating manner, thereby enhancing the performance of the first disturbing element 400 for disturbing the bubbles 500.

Please refer again to FIG. 5A. In some embodiments, the first maintaining element 402 further comprises one or more maintaining buckles 407 restricting the first disturbing element 400 at a specific location or within a specific distance range. The maintaining buckle 407 may be, but not limited to, a C-type ring, a U-type ring, a retaining ring, a washer, a nut, a retaining pin, a snap pin, or a dowel pin. The inner diameter of the maintaining buckle 407 is slightly greater than the outer diameter of the first maintaining string 404, so that the maintaining buckle 407 can be detachably or permanently fixed to the first maintaining string 404. In FIG. 5A, the first maintaining element 402 further comprises one maintaining buckle 407 being a C-type ring and between one end of the first disturbing element 400 (e.g., the left side of the first disturbing element 400) and one end of the first maintaining string 404. Therefore, through the maintaining buckle 407 configured at the one side of the first disturbing element 400, the first disturbing element 400 can move within a specific space or locations (e.g., the right-handed space of the first disturbing element 400) along the third direction D3 in a reciprocating manner, thereby maintaining the performance of the first disturbing element 400 for disturbing the bubbles 500. In some embodiments, the first disturbing element 400 further comprises two maintaining buckles 407 respectively at two ends of the first disturbing element 400. Therefore, through the maintaining buckles 407 configured at the two sides of the first disturbing element 400, the first disturbing element 400 can only move within a specific space or locations (i.e., between the maintaining buckles 407 respectively at the two sides of the first disturbing element 400) along the third direction D3 in a reciprocating manner. Alternatively, in some embodiments, through the maintaining buckles 407 configured at the two sides of the first disturbing element 400, the first disturbing element 400 can be even fixed in the third direction D3 (but still can move along the fourth direction D4 and/or rotate along the second direction D2). Hence, the performance of the first disturbing element 400 for disturbing the bubbles 500 can be maintained.

Please refer to FIG. 6A and FIG. 6B. FIG. 6A illustrates a schematic perspective view according to a third embodiment of a partial section A shown in FIG. 1A, and FIG. 6B illustrates a schematic view in the second view (i.e., the YZ plane) of an embodiment of a single immersion unit 30 of the immersion cooling system 10 shown in FIG. 6A (to illustrate each of the embodiments more clearly, in the instant disclosure, instead of showing all the elements and the bubbles 500, only some elements in the partial section A are shown in FIG. 6A to FIG. 6B). In some embodiments, the first maintaining element 402 comprises a first maintaining string 404. One of two ends of the first maintaining string 404 is maintained at the bracket 308, and the other end of the first maintaining string 404 is maintained at the first disturbing element 400. The term "connect/connected" may be, but not limited to, slidably connected, detachably or permanently fixed, or directly or indirectly connected. In FIG. 6B, the bracket 308 has a bracket depth G0 for receiving the boiler plate 302. A distance between the first disturbing element 400 and the boiler plate 302 is a first predetermined distance G1, and the first predetermined distance G1 may be less than, equal to, or even greater than the bracket depth G0. The bracket depth G0, the length of the first maintaining string 404, and the elastic coefficient of the first maintaining string 404 can be further adjusted based on the first predetermined distance G1 so as to prevent the first disturbing element 400 from directly contacting the boiler plate 302 during the disturbing. In some embodiments, the specific gravity of the first disturbing element 400 is substantially equal to the specific gravity of the heat transfer fluid 50. For example, the specific gravity of the first disturbing element 400 is slightly greater than or slightly less than the specific gravity of the heat transfer fluid 50.

Therefore, even though the first disturbing element 400 is hung from the upper side of the bracket 308 (as shown in FIG. 6A), the specific gravity of the first disturbing element 400 is substantially equal to the specific gravity of the heat transfer fluid 50, so the first disturbing element 400 can still be suspended in the heat transfer fluid 50 and move randomly by the maintenance of the first disturbing element 400 (along the third direction D3 or the fourth direction D4 shown in FIG. 6A) and/or randomly rotate (along the second direction D2 shown in FIG. 6A). Hence, the performance of the first disturbing element 400 for disturbing the bubbles 500 can be enhanced.

Please refer to FIG. 6A. In some embodiments, the first maintaining element 402 further comprises stopping elements 408 respectively at two sides of the bracket 308 corresponding to the two sides of the boiler plate 302. The material of each of the stopping elements 408 may be, but not limited to, Bakelite, metal, plastic, or combinations comprising any two or more thereof. In FIG. 6A, the first maintaining element 402 further comprises two stopping elements 408. The two stopping elements 408 are respectively at two sides of the bracket 308 corresponding to the two sides of the boiler plate 302 (e.g., the left and right sides in the proximity of the boiler plate 302). The heights and positions of the two stopping elements 408 are configured to be within a range of the permissible height to which the first disturbing element 400 swings at the two sides or the proximity of the boiler plate 302. Therefore, in some embodiments, through the stopping elements 408 at the two sides of the boiler plate 302, the first disturbing element 400 is restricted to move in a reciprocating manner within a specific space and locations. For example, in this embodiment, the first disturbing element 400 is restricted to move in a reciprocating manner within the range between the two sides of the boiler plate 302. Hence, the performance of the first disturbing element 400 for disturbing the bubbles 500 can be maintained. In some embodiments, the specific gravity of the first disturbing element 400 is slightly greater than the specific gravity of the heat transfer fluid 50. Hence, the first disturbing element 400 can be suspended in the heat transfer fluid with a slight drop in the direction of gravity. Moreover, when the first disturbing element 400 is stopped by the stopping elements 408, instead of being randomly suspended in heat transfer fluid 50, the first disturbing element 400 would still return to the original location resiliently in the heat transfer fluid 50 (that is, being suspended in the heat transfer fluid 50 with a slight drop in the direction of gravity).

Figures 6C, 6D, 6E, 6F:
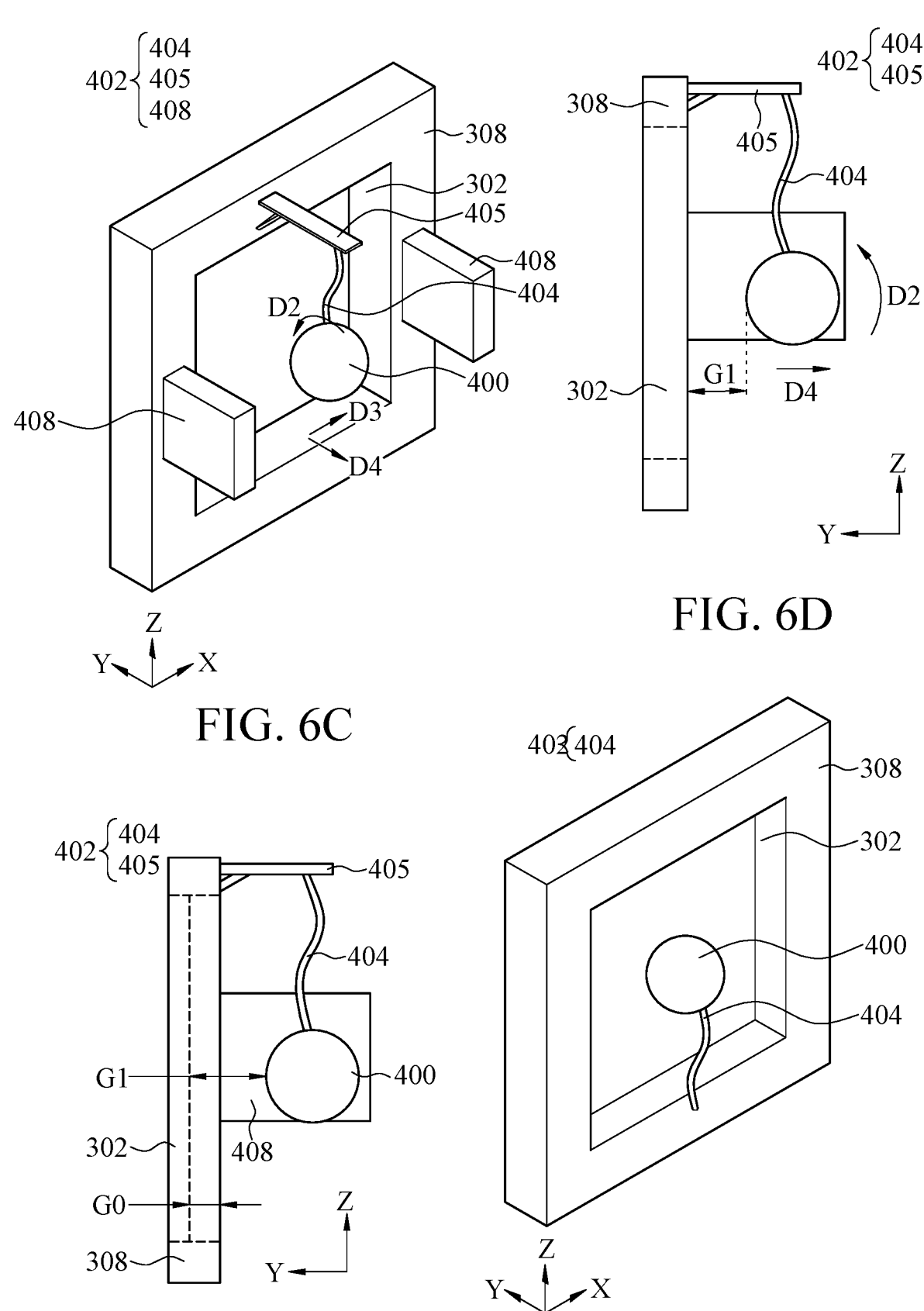
FIG. 6C illustrates a schematic perspective view according to a fourth embodiment of a partial section A shown in FIG. 1A.
FIG. 6D illustrates a schematic view in the second view (i.e., the YZ plane) according to a first embodiment of a single immersion unit of the immersion cooling system shown in FIG. 6C.
FIG. 6E illustrates a schematic view in the second view (i.e., the YZ plane) according to a second embodiment of a single immersion unit of the immersion cooling system shown in FIG. 6C.
FIG. 6F illustrates a schematic perspective view according to a fifth embodiment of a partial section A shown in FIG. 1A.

Please refer to FIG. 6C to FIG. 6E. FIG. 6C illustrates a schematic perspective view according to a fourth embodiment of a partial section A shown in FIG. 1A, and FIG. 6D to FIG. 6E respectively illustrate schematic views in the second view (i.e., the YZ plane) according to a first embodiment and a second embodiment of a single immersion unit 30 of the immersion cooling system 10 shown in FIG. 6C (to illustrate each of the embodiments more clearly, in the instant disclosure, instead of showing all the elements and the bubbles 500, only some elements in the partial section A are shown in FIG. 6C to FIG. 6E). In some embodiments, the first maintaining element 402 further comprises a first supporting seat 405 on the bracket 308 and corresponding to the first maintaining string 404 so as to be connected to the first maintaining string 404 and the bracket 308. The term "connect/connected" may be, but not limited to, slidably connected, detachably or permanently fixed, or directly or indirectly connected. In FIG. 6C to FIG. 6E, the first supporting seats 405 are on the upper sides of the brackets

308 to allow the first disturbing elements 400 to be much away from the boiler plates 302, thereby preventing the first disturbing elements 400 from directly contacting the boiler plate 302 during the disturbing. For example, in FIG. 6D, the surface of the boiler plate 302 and the surface of the bracket 308 are aligned with each other. Through the first supporting seat 405, a distance between the first disturbing element 400 and the boiler plate 302 can be a first predetermined distance G1. For another example, in FIG. 6E, the bracket 308 has a bracket depth G0 for receiving the boiler plate 302. Through the first supporting seat 405, a distance between the first disturbing element 400 and the boiler plate 302 can be a first predetermined distance G1 greater than the bracket depth G0. Therefore, through the configuration of the first supporting seat 405 and the bracket depth G0, the first disturbing element 400 can be prevented from directly contacting the boiler plate 302 during the disturbing.

Figures 6G, 6H, 6I:
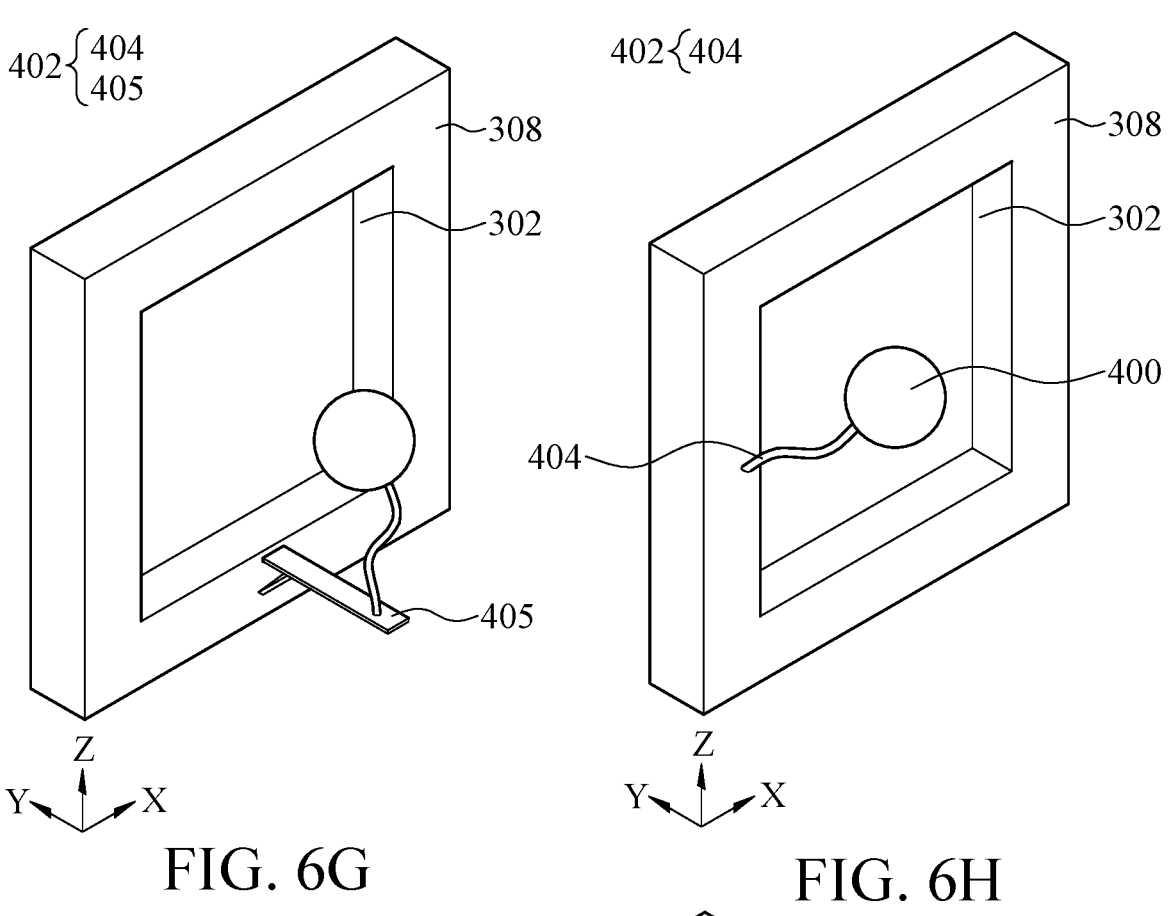
FIG. 6G illustrates a schematic perspective view according to a sixth embodiment of a partial section A shown in FIG. 1A.
FIG. 6H illustrates a schematic perspective view according to a seventh embodiment of a partial section A shown in FIG. 1A.
FIG. 6I illustrates a schematic perspective view according to an eighth embodiment of a partial section A shown in FIG. 1A.

Please refer to FIG. 6F and FIG. 6G. FIG. 6F and FIG. 6G respectively illustrates schematic perspective views according to a fifth embodiment and a sixth embodiment of a partial section A shown in FIG. 1A (to illustrate each of the embodiments more clearly, in the instant disclosure, instead of showing all the elements and the bubbles 500, only some elements in the partial section A are shown in FIG. 6F to FIG. 6G). In FIG. 6F and FIG. 6G, according to some embodiments, one of the two ends of the first maintaining string 404 is connected to one side of the boiler plate 302 (e.g., the lower side of the bracket 308 shown in FIG. 6F) or connected to one side of the bracket 308 through the first supporting seat 405 at one side of the bracket 308 (e.g., the lower side of the bracket 308 shown in FIG. 6G). The other end of the two ends of the first maintaining string 404 is connected to the first disturbing element 400. The term "connect/connected" may be, but not limited to, slidably connected, detachably or permanently fixed, or directly or indirectly connected. In addition, the embodiments shown in FIG. 6F and FIG. 6G can be respectively configured by referring to the implementations of the boiler plate 302 and the bracket 308 shown in FIG. 6D or FIG. 6E, which will not be described in detail herein. Since the specific gravity of the first disturbing element 400 is slightly less than the specific gravity of the heat transfer fluid 50, the first disturbing element 400 can be relatively not that significantly affected by gravity. Therefore, through the maintenance of the first maintaining string 404, the first disturbing element 400 can randomly move upwards (along the third direction D3 or the fourth direction D4 shown in FIG. 6A) and/or randomly rotate (along the second direction D2 shown in FIG. 6A) in the heat transfer fluid 50 due to buoyancy. Hence, the performance of the first disturbing element 400 for disturbing the bubbles 500 can be enhanced.

Figure 6J:
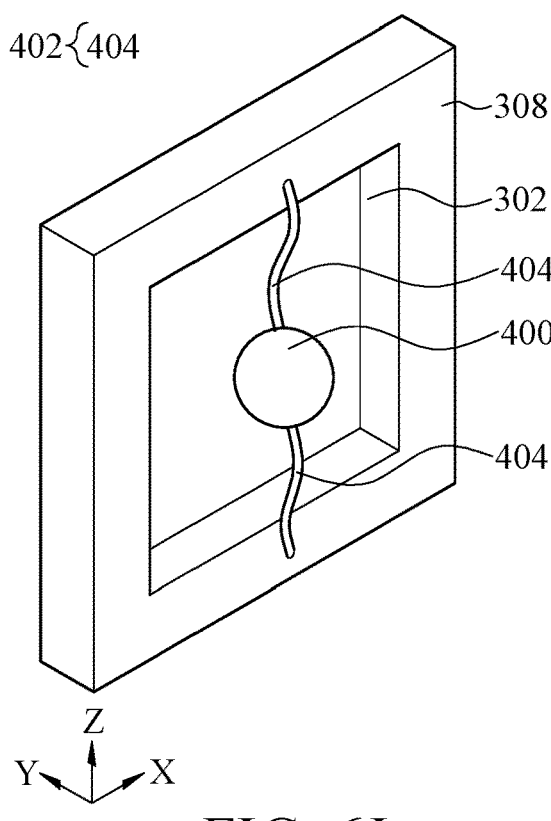
FIG. 6J illustrates a schematic perspective view according to a ninth embodiment of a partial section A shown in FIG. 1A.
Figure 6K:
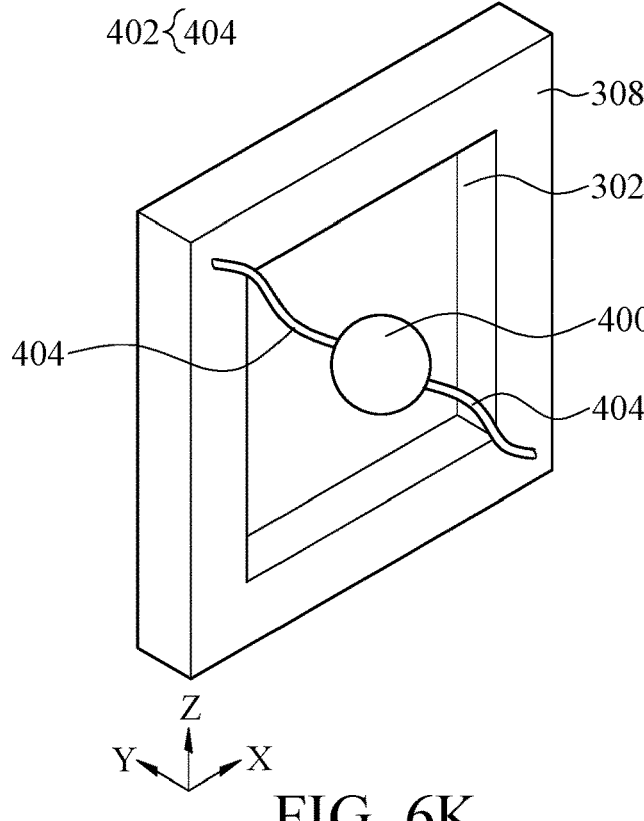
FIG. 6K illustrates a schematic perspective view according to a tenth embodiment of a partial section A shown in FIG. 1A.

Please refer to FIG. 6H to FIG. 6K. FIG. 6H to FIG. 6K respectively illustrate schematic perspective views according to a seventh embodiment to a tenth embodiment of a partial section A shown in FIG. 1A (to illustrate each of the embodiments more clearly, in the instant disclosure, instead of showing all the elements and the bubbles 500, only some elements in the partial section A are shown in FIG. 6H to FIG. 6K). In FIG. 6H, according to some embodiments, one end of the two ends of the first maintaining string 404 is connected to one side of the bracket 308 (e.g., either the left or right side of the bracket 308 shown in FIG. 6H; e.g., the left side) or connected to one side of the bracket 308 through the first supporting seat 405 at the side of the bracket 308 (e.g., either the left or right side of the bracket 308 shown in FIG. 6H; e.g., the left side); and the other end of the two ends of the first maintaining string 404 is connected to the first disturbing element 400. In FIG. 6I, according to some embodiments, the first maintaining element 402 comprises two first maintaining strings 404, and one of the two ends of each of the first maintaining string 404 is connected to one side of the bracket 308 (e.g., the left side or the right side of the bracket 308 shown in FIG. 6I) or connected to one side of the bracket 308 through the first supporting seat 405 at one side of the bracket 308 (e.g., the lower side of the bracket 308 shown in FIG. 6I). The other end of the two ends of each of the first maintaining string 404 is respectively connected to the two sides of the first disturbing element 400. In FIG. 6J, according to some embodiments, one of the two ends of each of the first maintaining string 404 is connected to one side of the bracket 308 (e.g., either the upper or lower side of the bracket 308 shown in FIG. 6J) or connected to one side of the bracket 308 through the first supporting seat 405 at the side of the bracket 308 (e.g., either the upper or lower side of the bracket 308 shown in FIG. 6J). The other end of the two ends of each of the first maintaining string 404 is respectively connected to the two sides of the first disturbing element 400. In FIG. 6K, according to some embodiments, one of the two ends of each of the first maintaining string 404 is connected to any one of the four corners of the bracket 308 (e.g., either the left top corner or the right bottom corner of the bracket 308 shown in FIG. 6K) or connected to one side of the bracket 308 through the first supporting seat 405 at the one of the four corners of the bracket 308 (e.g., either the left top corner or the right bottom corner of the bracket 308 shown in FIG. 6K). The other end of the two ends of each of the first maintaining string 404 is respectively connected to the two sides of the first disturbing element 400. Hence, in some embodiments, the first disturbing element 400 can be configured in the proximity of the boiler plate 302 in various manners to maintain the performance of the first disturbing element 400 for disturbing the bubbles 500.

Figure 7:
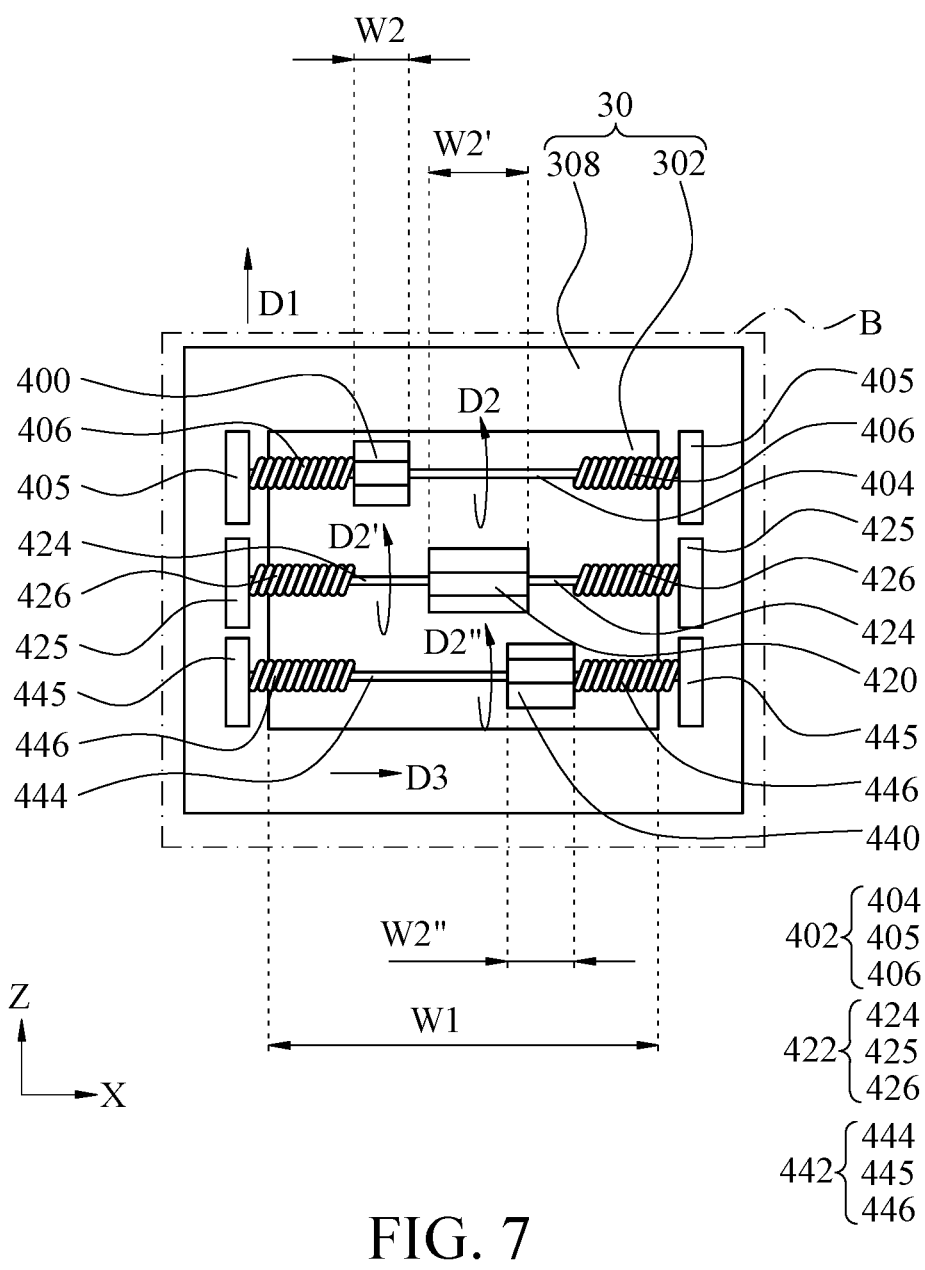
FIG. 7 illustrates a schematic working view in the first view (i.e., the XZ plane) according to an eleventh embodiment of a partial section A shown in FIG. 1A.
Figure 8:
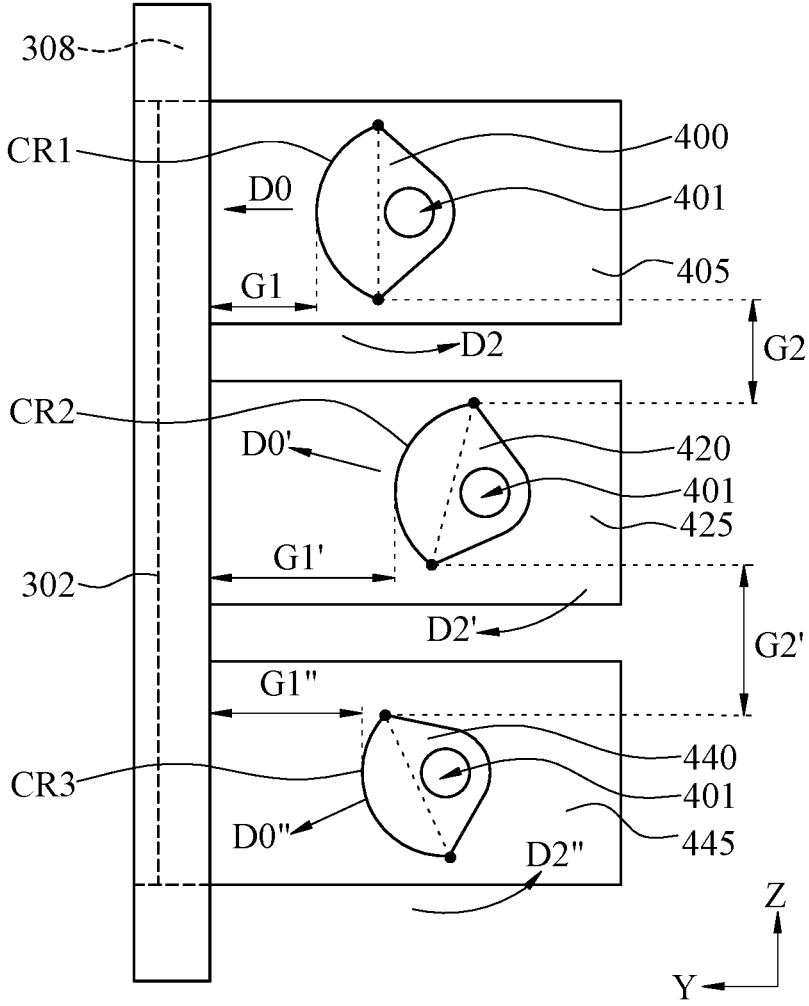
FIG. 8 illustrates a schematic view in the second view (i.e., the YZ plane) of an embodiment of a single immersion unit of the immersion cooling system shown in FIG. 7.

Please refer to FIG. 7 and FIG. 8. FIG. 7 illustrates a schematic working view in the first view (i.e., the XZ plane) according to an eleventh embodiment of a partial section A shown in FIG. 1A, and FIG. 8 illustrates a schematic view in the second view (i.e., the YZ plane) of an embodiment of a single immersion unit 30 of the immersion cooling system 10 shown in FIG. 7 (to illustrate each of the embodiments more clearly, in the instant disclosure, instead of showing all the elements and the bubbles 500, only some elements in the partial section A are shown in FIG. 7, and only a first disturbing element 400, a second disturbing element 420, a third disturbing element 440, and the boiler plate 302 are shown in FIG. 8). In some embodiments, the immersion cooling system 10 further comprises a second disturbing element 420, a second maintaining element 422, a third disturbing element 440, and a third maintaining element 442. The second disturbing element 420 has a second convex surface CR2. The second maintaining element 422 maintains the second disturbing element 420 to allow a convex direction D0' of the second convex surface CR2 towards the boiler plate 302. A distance between the second convex surface CR2 and the boiler plate 302 is a second predetermined distance G1'. The third disturbing element 440 has a third convex surface CR3. The third maintaining element 442 maintains the third disturbing element 440 to allow a convex direction D0" of the third convex surface CR3 towards the boiler plate 302. A distance between the third convex surface CR3 and the boiler plate 302 is a third predetermined distance G1". Any two of the first predetermined distance G1, the second predetermined distance G1', and the third predetermined distance G1" may be substantially identical or different from each other. A gap G2 (or a gap G2') is between the first disturbing element 400 and the second disturbing element 420 adjacent to each other (or between the second disturbing element 420 and the third disturbing element 440 adjacent to each other). The gaps G2, G2' may be substantially identical or different from each other. The second disturbing element 420 (and the second maintaining element 422, the second maintaining string 424, the second supporting seat 425, and the second resilient element 426, each of which corresponding to the second disturbing element 420), the third disturbing element 440 (and the third maintaining element 442, the third maintaining string 444, the third supporting seat 445, and the third resilient element 446, each of which corresponding to the third disturbing element 440) and the connection between the components can be referred to the implementations of the first disturbing element 400 (and the first maintaining element 402, the first maintaining string 404, the first supporting seat 405, and the first resilient element 406, each of which corresponding to the first disturbing element 400) and the connection between the components, which will not be described in detail herein. Hence, in some embodiments, through various combinations of the first predetermined distance G1, the second predetermined distance G1', the third predetermined distance G1", and/or the gaps G2, G2', much more combinations with different performances for disturbing the bubbles 500 can be provided. Therefore, the performance of the disturbing element for disturbing the bubbles 500 can be enhanced.

In FIG. 7 and FIG. 8, the convex direction D0 of the first disturbing element 400, the convex direction D0' of the second disturbing element 420, and the convex direction D0" of the third disturbing element 440 are configured to be synchronously and normally towards the boiler plate 302. The first predetermined distance G1 between the boiler plate 302 and the first disturbing element 400, the second predetermined distance G1' between the boiler plate 302 and the second disturbing element 420, and the third predetermined distance G1" between the boiler plate 302 and the third disturbing element 440 are different from each other. The gap G2 between the first disturbing element 400 and the second disturbing element 420 is also different from the gap G2' between the second disturbing element 420 and the third disturbing element 440. In some embodiments, along the X direction shown in FIG. 7, for example, the boiler plate 302 has a boiler plate width W1; furthermore, the first disturbing element 400 has a first width W2, the second disturbing element 420 has a second width W2', and the third disturbing element 440 has a third width W2". The first width W2, the second width W2', and the third width W2" may be identical or different from each other. The first width W2, a second width W2', and a third width W2" may all be less than the boiler plate width W1. Therefore, according to some embodiments, through the disturbing elements having various designs of the convex surfaces and capable of rotating synchronously in the identical or different rotation directions (e.g., the second directions D2, D2', D2") and/or moving in the identical of different movement directions (e.g., the third direction D3 or the fourth direction D4 shown in FIG. 8), much more combinations with different performances for disturbing the bubbles 500 can be provided. Hence, the performance of the disturbing element for disturbing the bubbles 500 can be enhanced.

Please refer again to FIG. 7. In some embodiments, the disturbing element further comprises one or more resilient elements. Take a first disturbing element 400 and first resilient elements 406 shown in FIG. 7 as an example, the first maintaining element 402 further comprises one or more first resilient elements 406 between the first disturbing element 400 and the first maintaining element 402 (e.g., the first supporting seat 405). In some embodiments, at least one of the first resilient elements 406 is elastic and capable of accumulating elastic potential energy and generating a resilient force; for example, the first resilient elements 406 are springs. When the first disturbing element 400 moves to the +X direction shown in FIG. 7 along the third direction D3 (i.e., the +X direction shown in FIG. 7), since the first resilient element 406 with elasticity is compressed by the first disturbing element 400, the first resilient element 406 would generate a reaction force to return along a direction opposite to the third direction D3 (e.g., the −X direction shown in FIG. 7). Hence, the first disturbing element 400 would be forced by the reaction force of the first resilient element 406 to move along the −X direction shown in FIG. 7 on the first maintaining string 404. Accordingly, through the first resilient elements 406 with elasticity, the first disturbing element 400 can continuously move between two sides of the first maintaining string 404 (i.e., two sides of the boiler plate 302) in a reciprocating manner, thereby enhancing the performance of the first disturbing element 400 for disturbing the bubbles 500. The second disturbing element 420 (and the corresponding second resilient elements 426) and the third disturbing element 440 (and the corresponding third resilient elements 446) can be also configured by referring to the configuration of the first disturbing element 400 (and the corresponding first resilient elements 406), which will not be described in detail herein. Therefore, a plurality of the disturbing elements (e.g., the first disturbing element 400, the second disturbing element 420, and the third disturbing element 440) moving between two sides of the boiler plate 302 in a reciprocating manner can further enhance the performance of the overall disturbing elements for disturbing the bubbles 500.

In some embodiments, the disturbing element is magnetic and the resilient elements can be respectively magnetized (e.g., by electromagnetic induction), where the polarity of the resilient elements is opposite to the polarity of the disturbing element. Take a first disturbing element 400 and first resilient elements 406 shown in FIG. 7 as an example. the first resilient elements 406 can be asynchronously magnetized (e.g., by electromagnetic induction), so that only one of the first resilient elements 406 is magnetized at the same time. For example, in a first time interval, the first resilient elements 406 on the +X direction shown in FIG. 7 is not magnetized, the first disturbing element 400 has, for example, a north pole (N), and the first resilient element 406 is temporarily magnetized to have, for example, a south pole (S). The first disturbing element 400 would be attracted by the magnetic force of the first resilient element 406 on the +X direction shown in FIG. 7 to further move to the +X direction shown in FIG. 7. Next, in a second time interval, the first resilient element 406 on the −X direction shown in FIG. 7 is temporarily magnetized to have, for example, a south pole (S), and the first resilient element 406 on the +X direction shown in FIG. 7 is not magnetized. The first disturbing element 400 would be attracted by the magnetic force of the first resilient element 406 on the −X direction shown in FIG. 7 to further move to the −X direction shown in FIG. 7. Next, the above two steps of magnetization are repeated. Hence, through intermittently or periodically magnetizing the first resilient elements 406 on the two sides, the first disturbing element 400 can continuously move between the two sides of the first maintaining string 404 (i.e., the two sides of the boiler plate 302) in a reciprocating manner, thereby enhancing the performance of the first disturbing element 400 for disturbing the bubbles 500. The second disturbing element 420 (and the corresponding second resilient elements 426) and the third disturbing element 440 (and the corresponding third resilient elements 446) can be also configured by referring to the configuration of the first disturbing element 400 (and the corresponding first resilient elements 406), which will not be described in detail herein. Therefore, a plurality of the disturbing elements (e.g., the first disturbing element 400, the second disturbing element 420, and the third disturbing element 440) moving between two sides of the boiler plate 302 in a reciprocating manner can further enhance the performance of the overall disturbing elements for disturbing the bubbles 500.

Figure 9:
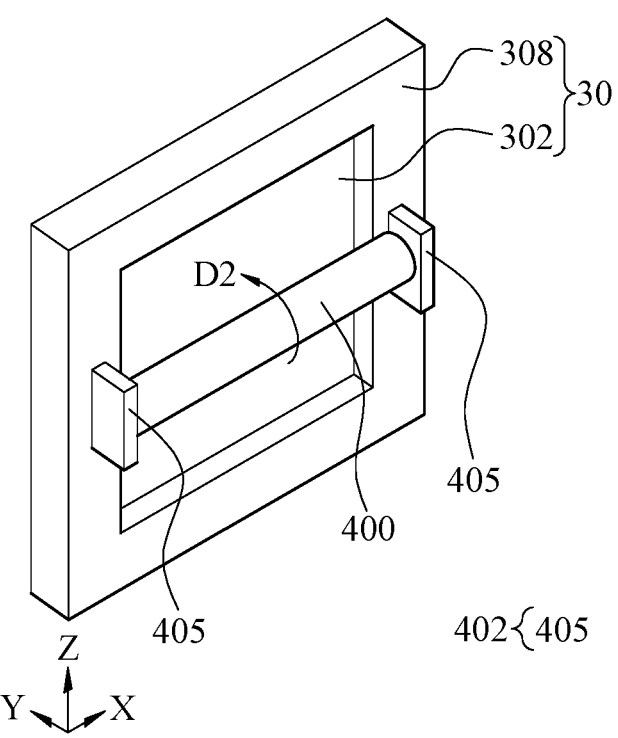
FIG. 9 illustrates a schematic perspective and working view according to a twelfth embodiment of a partial section A shown in FIG. 1A.
Figure 10:
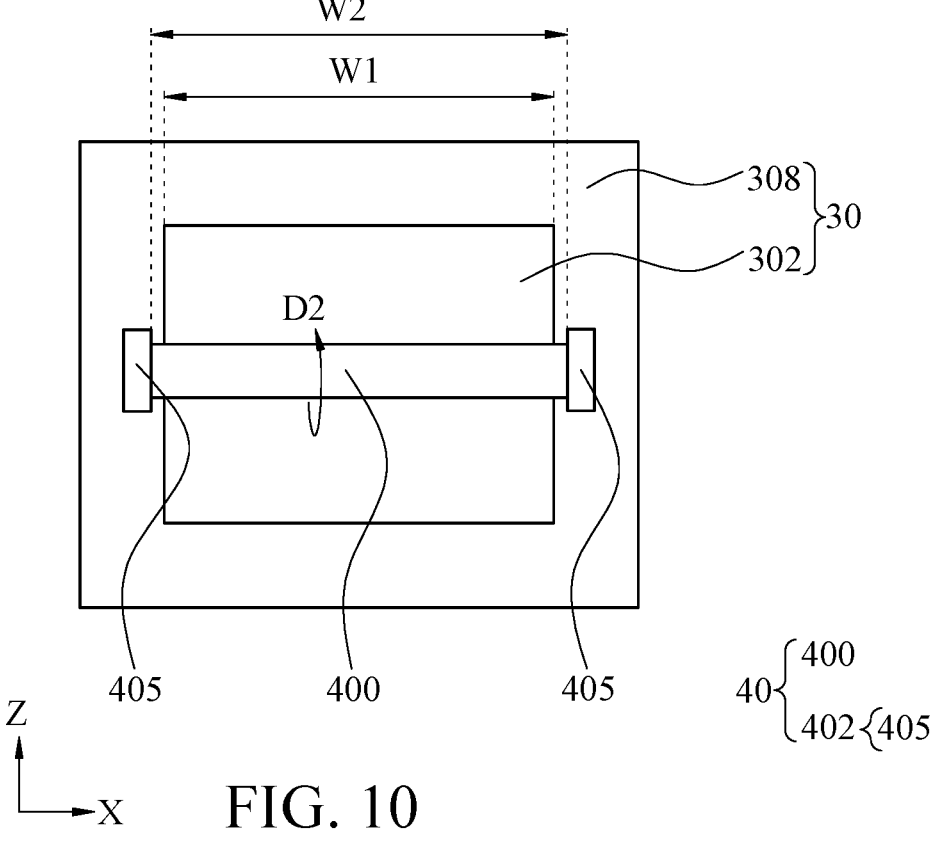
FIG. 10 illustrates a schematic working view in the first view (i.e., the XZ plane) according to some embodiments of a single immersion unit of the immersion cooling system shown in FIG. 9.

Please refer to FIG. 9 and FIG. 10. FIG. 9 illustrates a schematic perspective and working view according to a twelfth embodiment of a partial section A shown in FIG. 1A, and FIG. 10 illustrates a schematic working view in the first view (i.e., the XZ plane) according to some embodiments of a single immersion unit 30 of the immersion cooling system 10 shown in FIG. 9 (to illustrate each of the embodiments more clearly, in the instant disclosure, instead of showing all the elements and the bubbles 500, only some elements in the partial section A are shown in FIG. 9 and FIG. 10). In FIG. 9 and FIG. 10, in some embodiments, the first maintaining element 402 comprises two first supporting seats 405 respectively at two sides of the bracket 308, and two ends of the first disturbing element 400 are rotatably (e.g., along the second direction D2) configured to the two first supporting seats 405. The first disturbing element 400 has a first convex surface CR1. The first supporting seat 405 of the first maintaining element 402 is connected to the first disturbing element 400 to allow the convex direction D0 of the first convex surface CR1 normally towards the boiler plate 302. A distance between the first convex surface CR1 and the boiler plate 302 is a first predetermined distance G1. Implementations of each of the elements can be referred to the above implementations and thus will not be described in detail herein. In some embodiments, along the X direction shown in FIG. 10, for example, the first disturbing element 400 has a first width W2. The first width W2 may be roughly equal to or greater than the boiler plate width W1. Hence, the first disturbing element 400 across two sides of the boiler plate 302 can generate a greater disturbance in a wider range on the bubbles 500, thereby enhancing the performance of the disturbing element for disturbing the bubbles 500.

Figure 11:
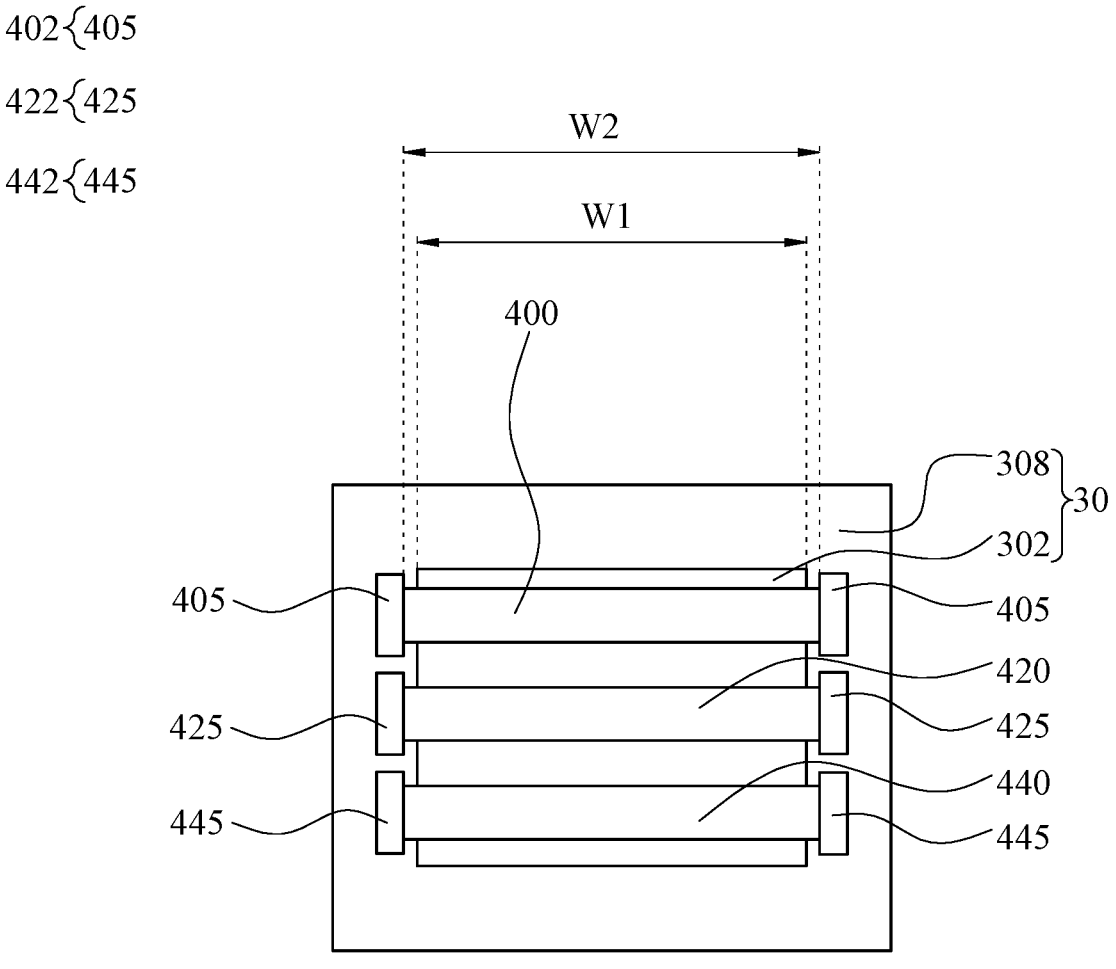
FIG. 11 illustrates a schematic working view according to a thirteenth embodiment in the first view (i.e., the XZ plane) of a partial section A shown in FIG. 1A.

Please refer to FIG. 11. FIG. 11 illustrates a schematic working view according to a thirteenth embodiment in the first view (i.e., the XZ plane) of a partial section A shown in FIG. 1A (to illustrate each of the embodiments more clearly, in the instant disclosure, instead of showing all the elements and the bubbles 500, only some elements in the partial section A are shown in FIG. 11). In some embodiments, the immersion cooling system 10 further comprises a second disturbing element 420 and a third disturbing element 440. The second disturbing element 420 has a second convex surface CR2. The third disturbing element 440 has a third convex surface CR3. The second disturbing element 420 (and the corresponding second supporting seat 425), the third disturbing element 440 (and the corresponding third supporting seat 445), and the connection between the components can be referred to the above description regarding the first disturbing element 400 (and the corresponding first supporting seat 405) and thus will not be described in detail herein. Therefore, according to some embodiments, through the disturbing elements having various designs of the convex surfaces (e.g., the first convex surface CR1, the second convex surface CR2, and the third convex surface CR3) and capable of rotating synchronously in the identical or different rotation directions and/or moving in the identical of different movement directions, much more combinations with different performances for disturbing the bubbles 500 can be provided. Hence, the performance of the disturbing element for disturbing the bubbles 500 can be enhanced.

Figure 12:
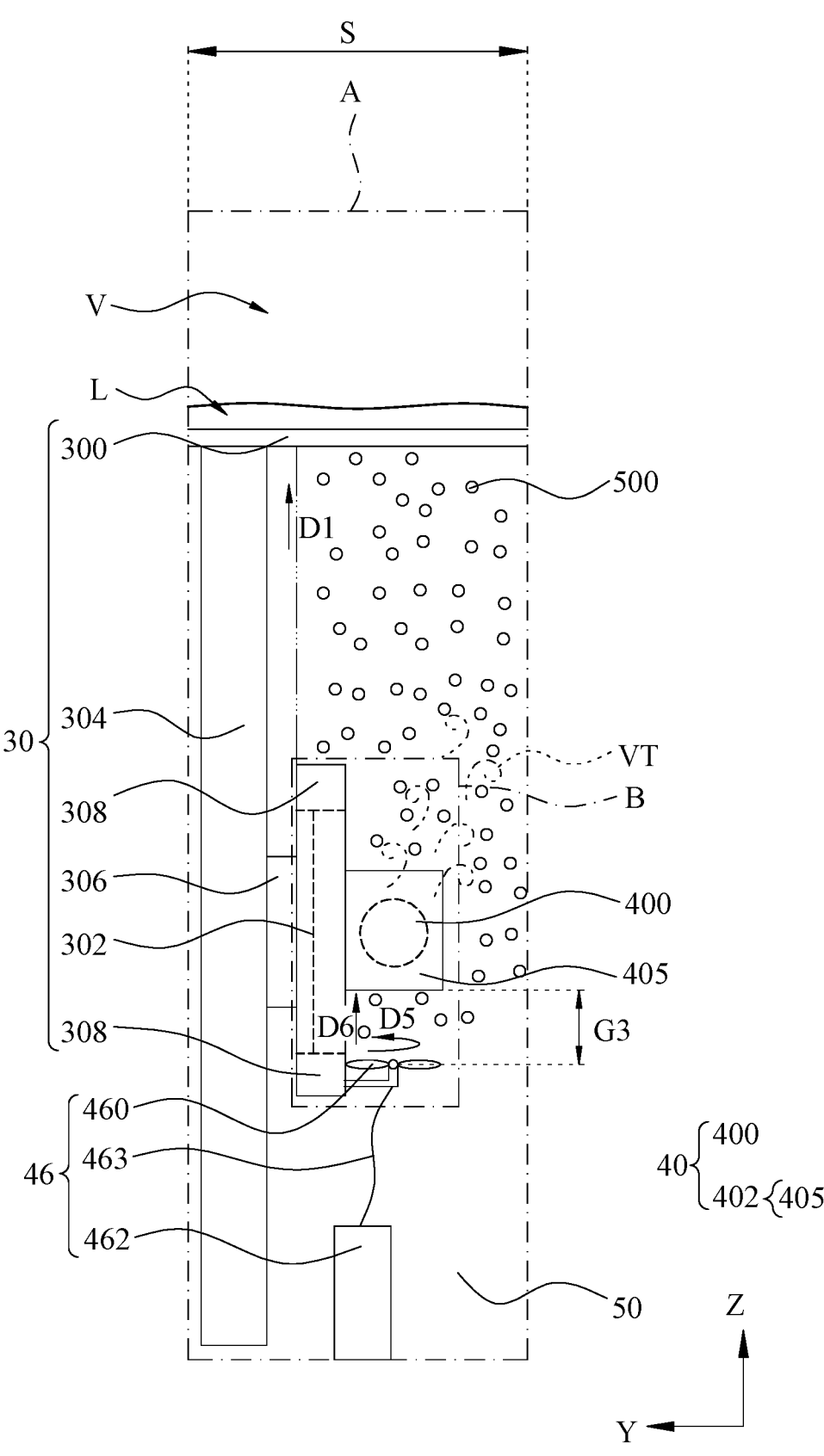
FIG. 12 illustrates a schematic working view in the second view (i.e., the YZ plane) of a partial section A of a single immersion unit of the immersion cooling system according to some embodiments.

Please refer to FIG. 12. FIG. 12 illustrates a schematic working view in the second view (i.e., the YZ plane) of a partial section A of a single immersion unit 30 of the immersion cooling system 10 according to some embodiments. In some embodiments, the immersion unit 30 further comprises an auxiliary unit 46 adjacent to the disturbing element (e.g., the first disturbing element 400). Hence, in some embodiments, through the auxiliary unit 46, the flowing velocity of the bubbles 500 in the proximity of the first disturbing element 400 can be enhanced. In FIG. 12, according to some embodiments, the auxiliary unit 46 is adjacent to the first disturbing element 400 but away from the surface of the heat transfer fluid 50. In some embodiments, a distance between the auxiliary unit 46 and the lower side of the first disturbing element 400 is an auxiliary distance G3. The auxiliary distance G3 may be, but not limited to, any value ranging between 10 mm and 20 mm. The auxiliary unit 46 comprises a rotation-disturbing element 460 and a rotation-disturbing driver 462. The rotation-disturbing element 460 is driven by the rotation-disturbing driver 462 to generate a disturbance in a direction toward the first disturbing element 400 (i.e., the sixth direction D6 shown in FIG. 12). In FIG. 12, the sixth direction D6 is substantially parallel to a direction (i.e., the first direction D1) that the overall bubbles 500 flow to the surface of the heat transfer fluid 50. In some embodiments, the rotation-disturbing element 460 may be a fan or other disturbing units with fan blades. The rotation-disturbing element 460 is electrically conducted to the rotation-disturbing driver 462 through a rotation-disturbing wire 463, so that the rotation-disturbing element 460 is driven by the rotation-disturbing driver 462 to further rotate along the fifth direction D5 (which may be counterclockwise or clockwise). Therefore, in some embodiments, through a manner of rotation disturbance, the flowing velocity of the bubbles 500 in the proximity of the first disturbing element 400 can be enhanced.

Figure 13:
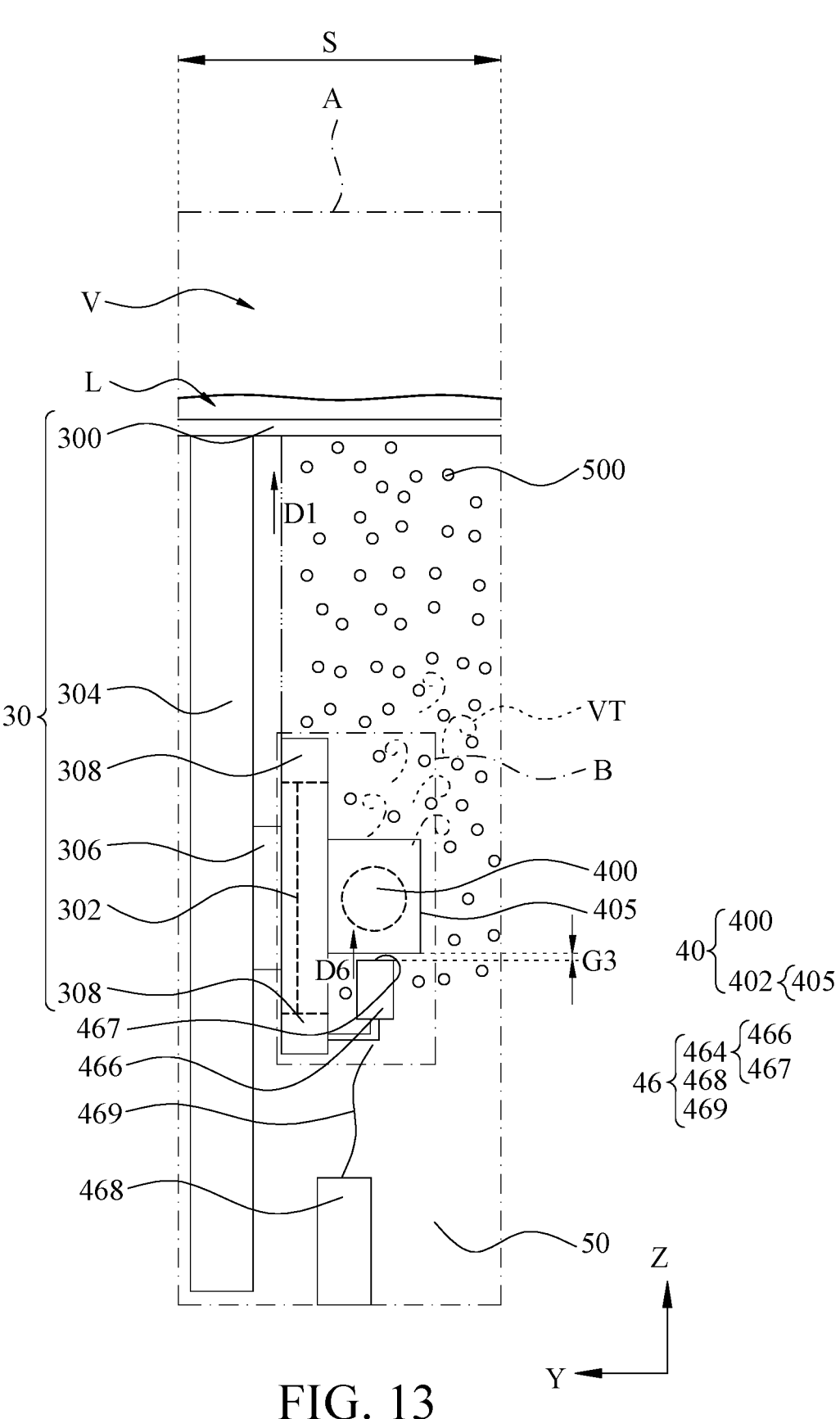
FIG. 13 illustrates a schematic working view in the second view (i.e., the YZ plane) of a partial section A of a single immersion unit of the immersion cooling system according to some embodiments.

Please refer to FIG. 13. FIG. 13 illustrates a schematic working view in the second view (i.e., the YZ plane) of a partial section A of a single immersion unit 30 of the immersion cooling system 10 according to some embodiments. In FIG. 13, according to some embodiments, the auxiliary unit 46 is adjacent to the first disturbing element 400 but away from the surface of the heat transfer fluid 50. In some embodiments, a distance between the auxiliary unit 46 and the lower side of the first disturbing element 400 is an auxiliary distance G3. The auxiliary distance G3 may be, but not limited to, any value ranging between 10 mm and 20 mm. The auxiliary unit 46 comprises a jetting element 464 and a jetting driver 468. The jetting element 464 is driven by the jetting driver 468 to generate a disturbance in a direction toward the first disturbing element 400 (i.e., the sixth direction D6 shown in FIG. 13). In FIG. 13, the sixth direction D6 is substantially parallel to a direction (i.e., the first direction D1) that the overall bubbles 500 flow to the surface of the heat transfer fluid 50. In some embodiments, the jetting element 464 may be a disturbing unit capable of generating a jet flow. For example, in FIG. 13, the jetting element 464 is a jetting body 466 having a nozzle 467. The jetting element 464 is electrically conducted to the jetting driver 468 through a jetting wire 469, so that the jetting element 464 is driven by the jetting driver 468 to further generate a disturbance along the sixth direction D6 through the nozzle 467. Therefore, in some embodiments, through a manner of jet-flow disturbance, the flowing velocity of the bubbles 500 in the proximity of the first disturbing element 400 can be enhanced.

Figure 14:
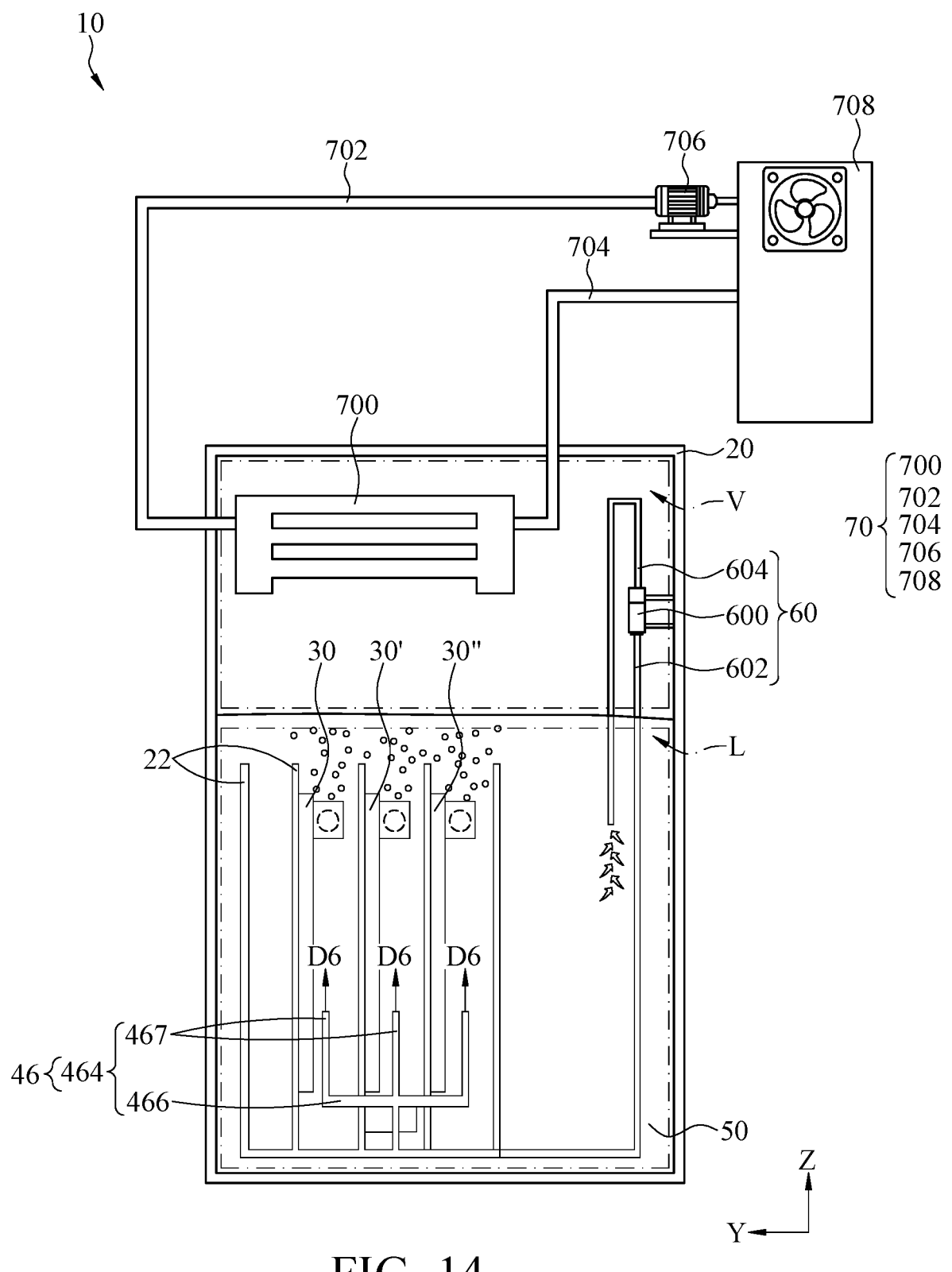
FIG. 14 illustrates a schematic working view of a plurality of immersion units of the immersion cooling system according to some embodiments.

Please refer to FIG. 14. FIG. 14 illustrates a schematic working view of a plurality of immersion units 30, 30', 30" of the immersion cooling system 10 according to some embodiments. In FIG. 14, according to some embodiments, the immersion cooling system 10 comprises a plurality of cabinets 22 (or a plurality of cooling tanks 20) and a plurality of immersion units 30, 30', 30" (which may respectively comprise, for example, the first disturbing element 400 that is not denoted) respectively corresponding to the cabinets 22 (or the cooling tanks 20). The immersion units 30, 30', 30" and the elements thereof may respectively correspond to the immersion units 30 and the elements thereof mentioned in the aforementioned embodiments, which will not be described in detail herein. Hence, in some embodiments, much more elements and devices to be cooled can be quickly cooled in the limited cooling space. Therefore, the heat transfer rate between the elements to be cooled and the heat transfer fluid 50 will not be apparently affected by the bubbles 500 in a large amount. Hence, in some embodiments, the utilization rate of the limited cooling space can be improved, and the elements and devices to be cooled can be configured more densely, thereby enhancing the working performance of the overall elements and devices (e.g., enhancing the overall power density).

Figure 15:
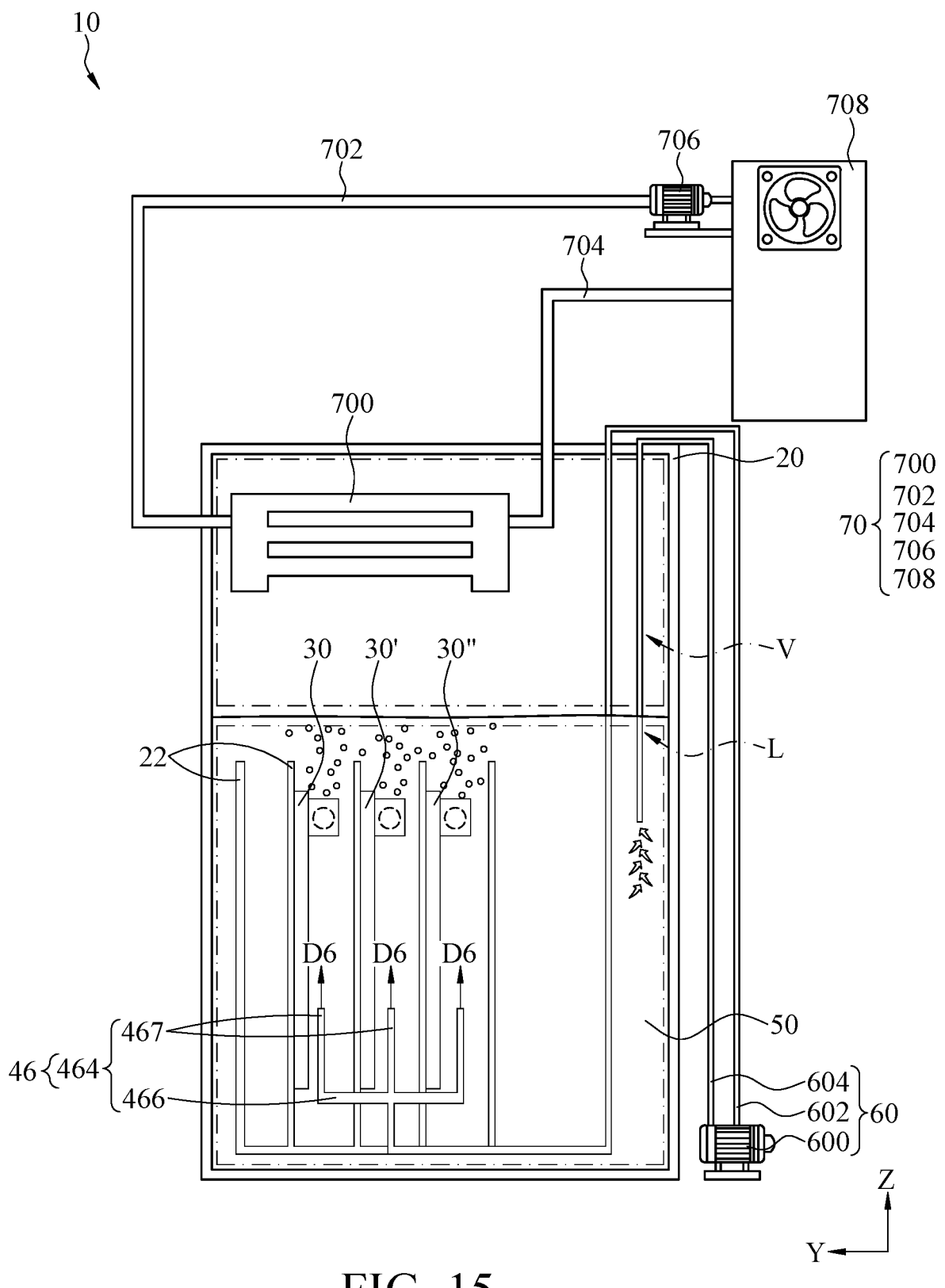
FIG. 15 illustrates a schematic working view of a plurality of immersion units of the immersion cooling system according to some embodiments.

Please refer to FIG. 14 and FIG. 15. FIG. 15 illustrates a schematic working view of a plurality of immersion units 30, 30', 30" of the immersion cooling system 10 according to some embodiments. In FIG. 14 and FIG. 15, according to some embodiments, a plurality of immersion units 30, 30', 30" may share the same auxiliary unit 46. For example, the auxiliary unit 46 is a jetting element 464 having a plurality of nozzles 467 and a jetting body 466. The nozzles 467 respectively correspond to the immersion units 30, 30', 30". Each of the nozzles 467 is driven by the jetting driver 468 (which is not further denoted in FIG. 14 and FIG. 15 but denoted in FIG. 13) to generate a disturbance in a direction toward the first disturbing element 400 (i.e., the sixth direction D6 shown in FIG. 14 and FIG. 15). Hence, efficiencies of removing the bubbles 500 in a plurality of immersion units 30, 30', 30" can be synchronously enhanced, so that the heat transfer rates between the elements to be cooled and the heat transfer fluid 50 in the immersion units 30, 30', 30" can also be enhanced at the same time. In some embodiments, the immersion cooling system 10 further comprises a pump device 60. In FIG. 14 and FIG. 15, the pump device 60 has a jetting pump 600, a first pipeline 604, and a second pipeline 602. One end of the two ends of the first pipeline 604 is submerged by the surface of the heat transfer fluid 50. Both of the other end of the two ends of the first pipeline 604 and one end of the two ends of the second pipeline 602 are connected to the jetting pump 600. The other end of the two ends of the second pipeline 602 is connected to the jetting element 464. Hence, through the driving of the jetting pump 600, the heat transfer fluid 50 would be suctioned from the first pipeline 604 to pass through the second pipeline 602, and the heat transfer fluid 50 which is accelerated would be discharged from the jetting element 464. In these cases, the jetting pump 600 can be inside the cooling tank 20 (e.g., as shown in FIG. 14) or outside the cooling tank 20 (e.g., as shown in FIG. 15). Therefore, the heat transfer fluid 50 away from the elements to be cooled and thus having a lower temperature can be suctioned. The suctioned heat transfer fluid 50 can further serve as the driving force of the acceleration of the bubbles 500 in the immersion units 30, 30', 30". Hence, the heat transfer rate between each of the elements to be cooled and the heat transfer fluid 50 can be more efficiently enhanced.

In some embodiments, the immersion cooling system 10 comprises a plurality of immersion units 30, 30', 30", which may be configured according to the implementations described in FIG. 14, FIG. 15, or any combinations thereof, and thus more various assembly embodiments thereof can be provided. Even though the corresponding figures are not further illustrated herein, the above embodiments should all be included in the embodiments of the instant disclosure. Hence, in some embodiments, the utilization rate of the limited cooling space can be enhanced by the immersion cooling system 10, and the elements and devices to be cooled can be configured more densely. Therefore, the working performance of the overall elements and devices (e.g., enhancing the overall power density) can be enhanced.

Figures 16, 17:
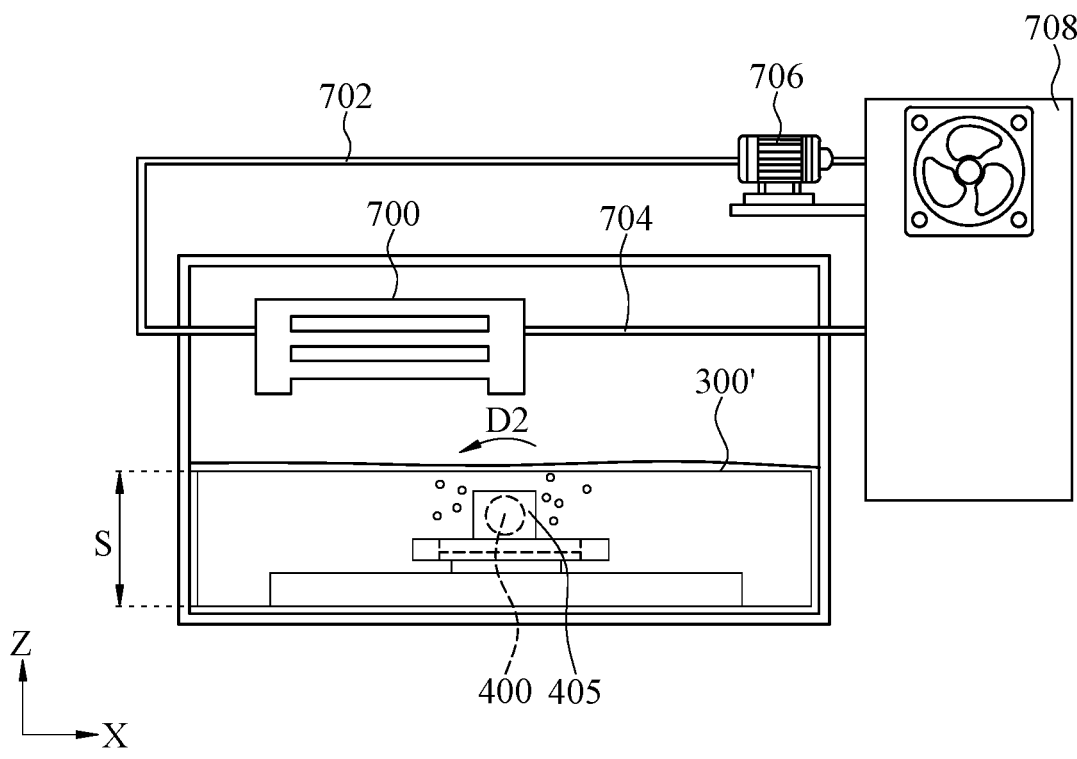
FIG. 16 illustrates a schematic working view in the first view (i.e., the XZ plane) of a single immersion unit of the immersion cooling system according to some embodiments.
FIG. 17 illustrates a schematic working view in the first view (i.e., the XZ plane) of a single immersion unit of the immersion cooling system according to some embodiments.

Please refer to FIG. 16 and FIG. 17. FIG. 16 and FIG. 17 respectively illustrate schematic working views in the first view (i.e., the XZ plane) of a single immersion unit 30 of the immersion cooling system 10 according to some embodiments (to illustrate each of the embodiments more clearly, in the instant disclosure, only the first disturbing element 400 and the first supporting seat 405 are shown in FIG. 16, only the first disturbing element 400, the second disturbing element 420, and the third disturbing element 440 are shown in FIG. 17, and the other elements can be referred to the above implementations, which will not be further described herein). In FIG. 16 and FIG. 17, according to some embodiments, the boiler plate 302 is substantially fixed to the main body frame 300'. The boiler plate 302 has a main surface, and the main surface is a surface contacting the heat transfer fluid 50. The main surface faces the surface of the heat transfer fluid 50 and is substantially parallel to the surface of the heat transfer fluid 50. Hence, in some embodiments, the direction that the bubbles 500 leave the boiler plate 302 is substantially identical or similar to the direction that the bubbles 500 move to the gas-phase space V. Therefore, the boiler plate 302 can be extendingly configured along the direction (e.g., the X direction shown in FIG. 16) that is substantially parallel to the surface of the heat transfer fluid 50. Alternatively, in some embodiments, the boiler plate 302 can be extendingly configured along the plane (e.g., the XY plane shown in FIG. 16) that is substantially parallel to the surface of the heat transfer fluid 50. Hence, the inner space of the immersion unit 30 can be more sufficiently utilized, thereby cooling more of the boiler plates 302 synchronously and more efficiently.

Figure 18A:
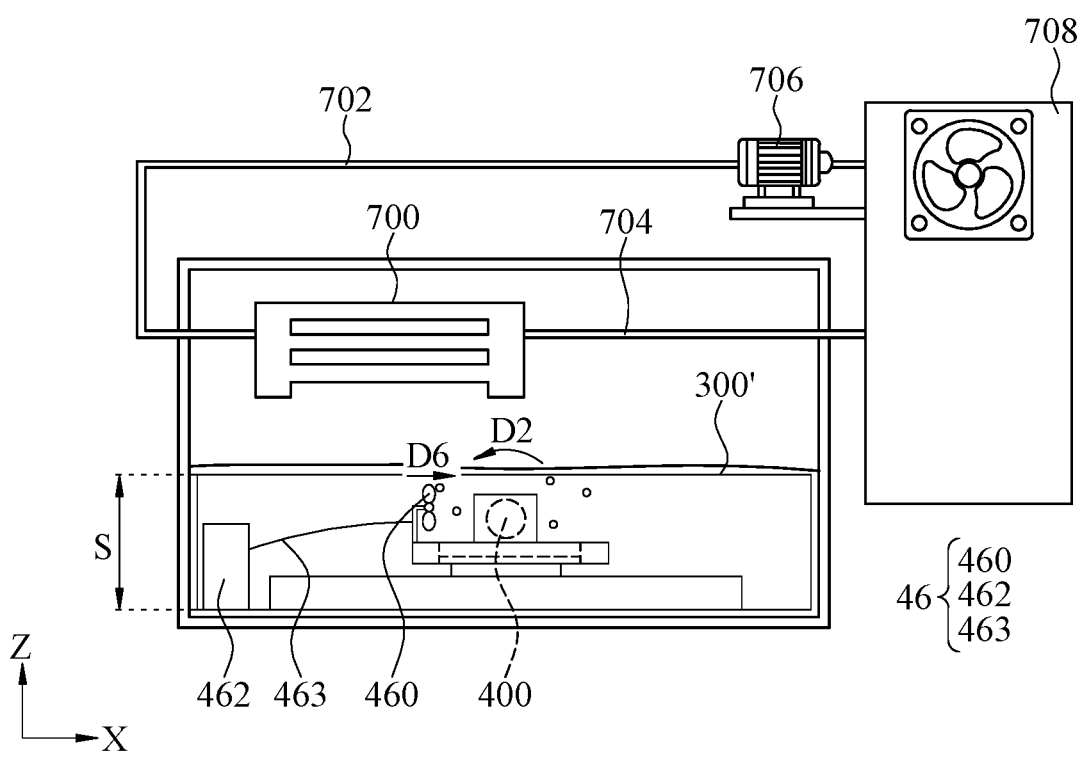
FIG. 18A illustrates a schematic working view in the first view (i.e., the XZ plane) of a single immersion unit of the immersion cooling system according to some embodiments.
Figure 18B:
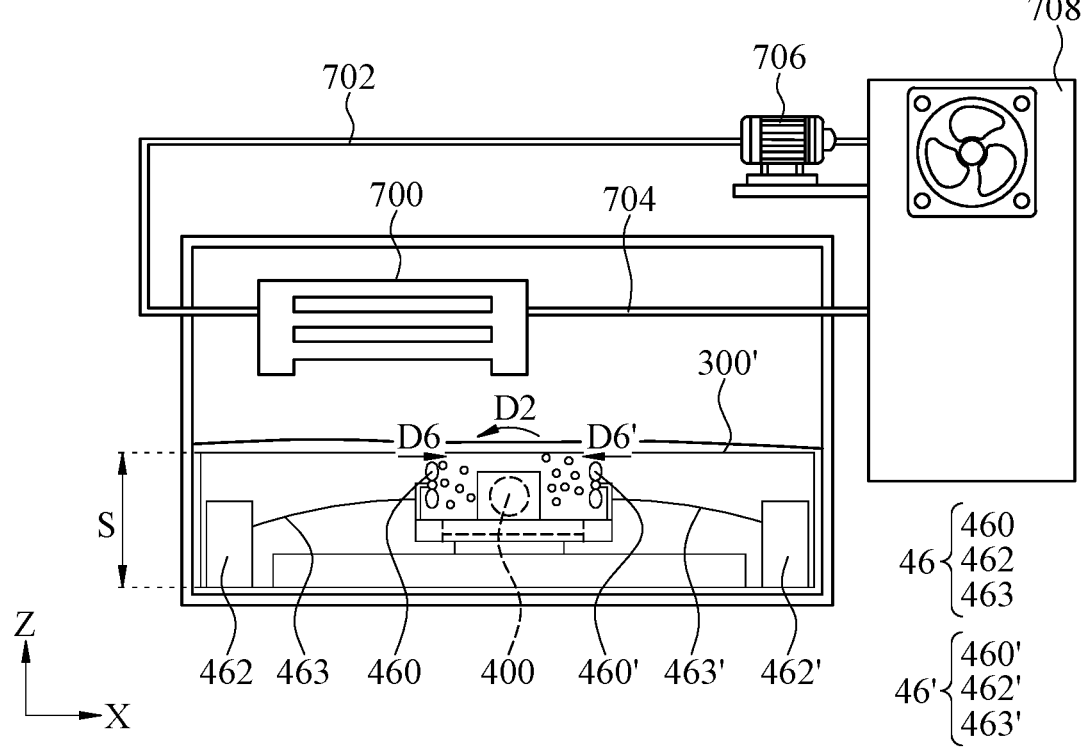
FIG. 18B illustrates a schematic working view in the first view (i.e., the XZ plane) of a single immersion unit of the immersion cooling system according to some embodiments.

Please refer to FIG. 18A and FIG. 18B. FIG. 18A and FIG. 18B respectively illustrate schematic working views in the first view (i.e., the XZ plane) of a single immersion unit 30 of the immersion cooling system 10 according to some embodiments (to illustrate each of the embodiments more clearly, in the instant disclosure, the immersion cooling system 10 and the immersion unit 30 are not further denoted and shown in FIG. 18A and FIG. 18B, and the other elements can be referred to the above implementations, which will not be further described herein). In FIG. 18A, according to some embodiments, the immersion unit 30 comprises an auxiliary unit 46 adjacent to the disturbing element (e.g., the first disturbing element 400). For example, the auxiliary unit 46 is on the bracket 308. A distance between the auxiliary unit 46 and the first disturbing element 400 may be, but not limited to, any value ranging between 10 mm and 20 mm. In some embodiments, the auxiliary unit 46 comprises a rotation-disturbing element 460 and a rotation-disturbing driver 462. The rotation-disturbing element 460 is driven by the rotation-disturbing driver 462 to generate a disturbance in a direction toward the first disturbing element 400 (i.e., the sixth direction D6 shown in FIG. 18A). In FIG. 18A, the sixth direction D6 is substantially parallel to the surface of the heat transfer fluid 50. In some embodiments, the rotation-disturbing element 460 may be a fan or other disturbing units with fan blades. The rotation-disturbing element 460 is electrically conducted to the rotation-disturbing driver 462 through a rotation-disturbing wire 463, so that the rotating-disturbing element 460 is driven by the rotation-disturbing driver 462 to further rotate along the fifth direction D5 (which may be counterclockwise or clockwise; not denoted in FIG. 18A but shown in FIG. 12). Therefore, in some embodiments, through a manner of rotation disturbance, the flowing velocity of the bubbles 500 in the proximity of the first disturbing element 400 can be enhanced.

In FIG. 18B, according to some embodiments, the immersion unit 30 comprises two auxiliary units 46, 46' respectively at two opposite sides of the first disturbing element 400 and adjacent to the first disturbing element 400. Distance between the auxiliary unit 46 and the first disturbing element 400 and distance between the auxiliary unit 46' and the first disturbing element 400 may respectively be, but not limited to, any value ranging between 10 mm and 20 mm. In some embodiments, the two auxiliary units 46, 46' respectively comprise the rotation-disturbing elements 460, 460' and the rotation-disturbing drivers 462, 462' respectively corresponding to the rotation-disturbing elements 460, 460'. The rotation-disturbing elements 460, 460' can respectively be a fan or other disturbing units with fan blades to be respectively driven by the rotation-disturbing drivers 462 to further rotate along the sixth directions D6, D6'. The sixth directions D6, D6' may be identical or different from each other. For example, in FIG. 18B, the sixth directions D6, D6' are opposite directions but substantially parallel to the surface of the heat transfer fluid 50. Therefore, the bubbles 500 can be guided to and thus collected at a specific location to prevent the bubbles 500 from escaping to the other locations. Hence, the bubbles 500 can be ensured to escape from the specific location to the gas-phase space V.

Figure 19A:
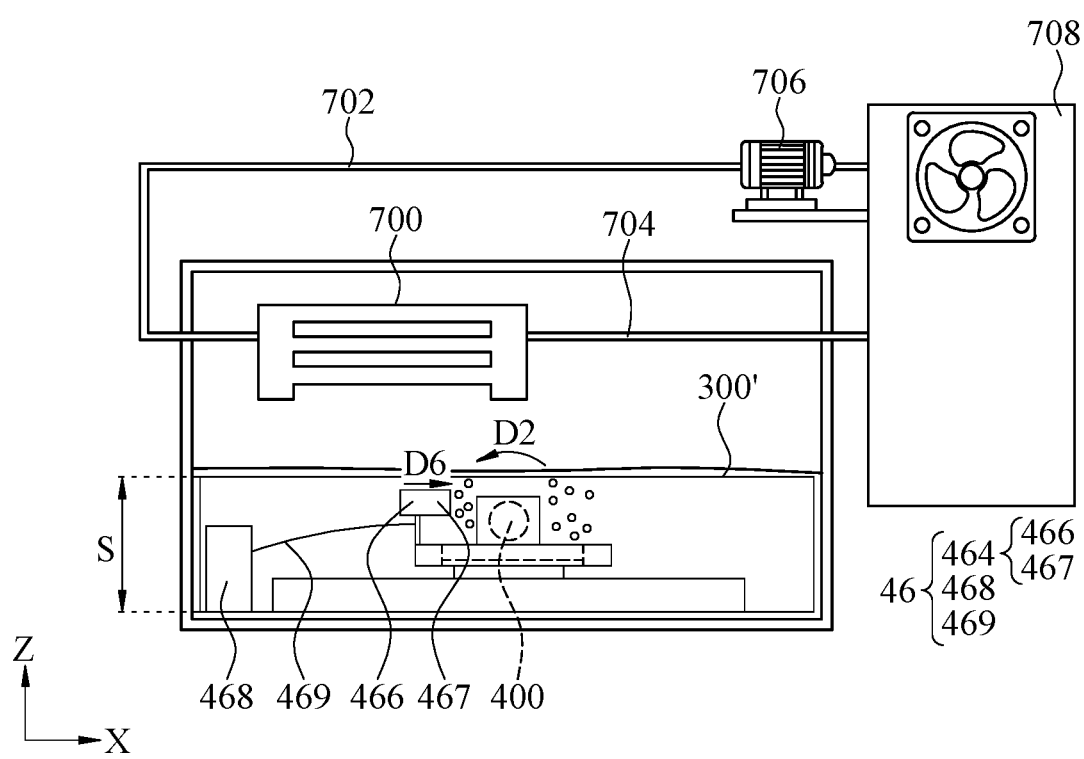
FIG. 19A illustrates a schematic working view in the first view (i.e., the XZ plane) of a single immersion unit of the immersion cooling system according to some embodiments.
Figure 19B:
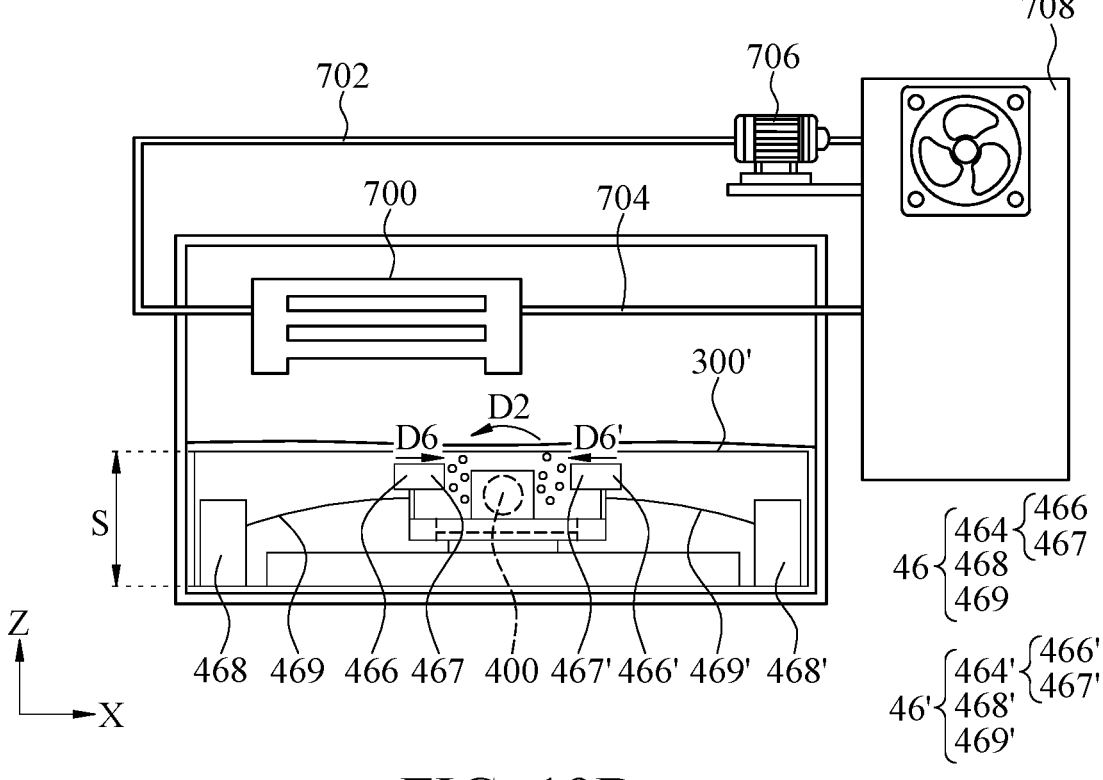
FIG. 19B illustrates a schematic working view in the first view (i.e., the XZ plane) of a single immersion unit of the immersion cooling system according to some embodiments.

Please refer to FIG. 19A and FIG. 19B. FIG. 19A and FIG. 19B respectively illustrate schematic working views in the first view (i.e., the XZ plane) of a single immersion unit 30 of the immersion cooling system 10 according to some embodiments (to illustrate each of the embodiments more clearly, in the instant disclosure, the immersion cooling system 10 and the immersion unit 30 are not further shown in FIG. 19A and FIG. 19B, and the other elements can be referred to the above implementations, which will not be further described herein). In FIG. 19A, according to some embodiments, the immersion unit 30 comprises an auxiliary unit 46 adjacent to the disturbing element (e.g., the first disturbing element 400). For example, the auxiliary unit 46 is on the bracket 308. In some embodiments, the auxiliary unit 46 comprises a jetting element 464 and a jetting driver 468. The jetting element 464 is driven by the jetting driver 468 to generate a disturbance in a direction toward the first disturbing element 400 (i.e., the sixth direction D6 shown in FIG. 19A). In FIG. 19A, the sixth direction D6 is substantially parallel to a direction of the surface of the heat transfer fluid 50. In some embodiments, the jetting element 464 may be a disturbing unit capable of generating a jet flow. For example, in FIG. 19A, the jetting element 464 is a jetting body 466 having a nozzle 467. The jetting element 464 is electrically conducted through a jetting wire 469, so that the jetting driver 468 is driven by the jetting driver 468 to further generate a disturbance along the sixth direction D6 through the nozzle 467. Therefore, in some embodiments, through a manner of jet-flow disturbance, the flowing velocity of the bubbles 500 in the proximity of the first disturbing element 400 can be enhanced.

In FIG. 19B, according to some embodiments, the immersion unit 30 comprises two auxiliary units 46, 46' respectively at two opposite sides of the disturbing element (e.g., the first disturbing element 400) and adjacent to the disturbing element (e.g., the first disturbing element 400). The two auxiliary units 46, 46' respectively comprise the jetting elements 464, 464' and the jetting drivers 468, 468' respectively corresponding to the jetting elements 464, 464'. The jetting elements 464, 464' may respectively be jetting bodies 466, 466' having nozzles 467, 467'. The jetting element 464 is electrically conducted to the jetting driver 468 through a jetting wire 469, so that the jetting element 464 is driven by the jetting driver 468 to further generate a disturbance along the sixth direction D6 through the nozzle 467. The jetting element 464' is electrically conducted to the jetting driver 468' through a jetting wire 469', so that the jetting element 464' is driven by the jetting driver 468' to further generate a disturbance along the sixth direction D6' through the nozzle 467'. The sixth directions D6, D6' can be identical or different from each other. For example, in FIG. 19B, the sixth directions D6, D6' are opposite directions but substantially parallel to the surface of the heat transfer fluid 50. Therefore, the bubbles 500 can be guided to and thus collected at a specific location to prevent the bubbles 500 from escaping to the other locations. Hence, the bubbles 500 can be ensured to escape from the specific location to the gas-phase space V.

In some embodiments, the immersion unit 30 comprises two or more auxiliary units 46, 46'. The auxiliary units 46, 46' are at two opposite sides of the disturbing element (e.g., the first disturbing element 400) or adjacent to each other. Meanwhile, the auxiliary units 46, 46' are adjacent to the disturbing element (e.g., the first disturbing element 400). The auxiliary units 46, 46' may be independently the rotation-disturbing element 460 (which comprises the rotation-disturbing driver 462) or the jetting element 464 (which comprises the jetting driver 468). Hence, in some embodiments, through much more combinations and configurations of the auxiliary units 46, 46', the bubbles 500 can be guided to and thus collected at a specific location to prevent the bubbles 500 from escaping to the other locations. Therefore, the bubbles 500 can be ensured to escape from the specific location to the gas-phase space V.

In some embodiments that the immersion unit 30 is a single rack-mounted server unit, still referring to FIG. 1A, the main body frame 300 of the immersion unit 30 is a closed-type frame and the main body frame 300 does not comprise a cabinet 22. The first disturbing element 400 has a first convex surface CR1 with a convex direction D0 (as shown in FIG. 4B). The first maintaining element 402 maintains the first disturbing element 400 to allow the convex direction D0 of the first convex surface CR1 normally towards the boiler plate 302. A first predetermined distance G1 is between the first convex surface CR1 and the boiler plate 302 (as shown in FIG. 4B). The heating element 306 (as shown in FIG. 4A) of the immersion unit 30 contacts the boiler plate 302. When the electronic device 304 is in operation, since the gas-phase heat transfer fluid 50 contacting the boiler plate 302 is vaporized by absorbing the heats, a large number of bubbles 500 vaporized from the gas-phase heat transfer fluid 50 would be disturbed by the first disturbing element 400. Then, the bubbles 500 would further escape to the gas-phase space V and be condensed upon contacting the condenser 700 in the gas-phase space V. Hence, in some embodiments, through the disturbance of the first disturbing element 400, the heat transfer fluid 50 can be forced to leave the boiler plate 302 more quickly, thereby enhancing the overall cooling performance of the heat transfer fluid 50. The elements described herein (which may further comprise, for example, the bracket 308, the condensation device 70, the first condensation pipe 702, the second condensation pipe 704, the condensation pump 706, and the heat exchanger 708) and the corresponding implementations thereof can all be referred to the above implementations, which will not be described in detail herein.

To sum up, in some embodiments, bubbles of the heat transfer fluid would be generated in operation. Since a disturbing element (e.g., a first disturbing element) is configured in the proximity of the boiler plate, when the bubbles flow to the disturbing element or the proximity of the disturbing element, the bubbles of the heat transfer fluid would be disturbed by the disturbing element. Hence, vortexes with converging effects at the locations away from the boiler plate would be formed. The bubbles would be more efficiently disturbed by the disturbing element to further escape to a gas-phase space. Hence, the bubbles in a large amount can be prevented from being attached to the surface or the proximity of the boiler plate (or even randomly flowing to the other locations). Therefore, the heats of the boiler plate can be more efficiently removed. Furthermore, through improving the conditions of the bubbles (such as staying in place or flowing to other locations), pollutants generated at the surface or the proximity of the boiler plate can be removed at the same time. Therefore, the pollutants that would further affect the cooling performance of the boiler plate can be prevented from being accumulated at the surface or the proximity of the boiler plate. Hence, in some embodiments, the immersion cooling system can prevent from significantly affecting the original heat transfer rate of the heat transfer fluid and the original working performance of the boiler plate (as well as the attached elements of the boiler plate). Therefore, in some embodiments, the boiler plate and the attached elements of the boiler plate can reach superior working performances and service lives.

Although the present disclosure is disclosed in the foregoing embodiments as above, it is not intended to limit the instant disclosure. Any person who is familiar with the relevant art can make some changes and modifications without departing from the spirit and scope of the present disclosure. Therefore, the scope of the present disclosure shall be subject to the definition of the scope of patent application attached to the specification.

What is claimed is:

1. An immersion cooling system comprising:
a cooling tank having a receiving portion configured to receive a heat transfer fluid;
an immersion unit in the receiving portion and comprising a boiler plate configured to heat the heat transfer fluid to generate bubbles around the boiler plate;
a first disturbing element having a first convex surface; and
a first maintaining element maintaining the first disturbing element to allow a convex direction of the first convex surface towards the boiler plate so that the bubbles are guided by the first convex surface to locations away from the convex surface, wherein a first predetermined distance is between the first convex surface and the boiler plate.

2. The immersion cooling system according to claim 1, wherein the immersion unit comprises a bracket, the boiler plate is in the bracket, the first maintaining element comprises two first maintaining strings, one of two ends of each of the first maintaining strings is maintained at the first disturbing element, and another end of each of the first maintaining strings is maintained at the bracket to allow the convex direction of the first convex surface towards the boiler plate.

3. The immersion cooling system according to claim 2, further comprising:
a second disturbing element having a second convex surface;
a second maintaining element maintaining the second disturbing element to allow a convex direction of the second convex surface towards the boiler plate, wherein a second predetermined distance is between the second convex surface and the boiler plate;
a third disturbing element having a third convex surface; and
a third maintaining element maintaining the third disturbing element to allow a convex direction of the third convex surface towards the boiler plate, wherein a third predetermined distance is between the third convex surface and the boiler plate;
wherein a gap is between two adjacent ones of the first, second and third disturbing elements.

4. The immersion cooling system according to claim 1, wherein the immersion unit comprises a bracket, the boiler plate is in the bracket, the first maintaining element comprises a first maintaining string, two ends of the first maintaining string are maintained at the bracket, and the first maintaining string passes through the first disturbing element.

5. The immersion cooling system according to claim 4, wherein the first maintaining element further comprises a maintaining buckle maintaining the first disturbing element at the first maintaining string.

6. The immersion cooling system according to claim 4, wherein the first disturbing element is slidably configured at the first maintaining string.

7. The immersion cooling system according to claim 6, further comprising the heat transfer fluid, wherein the heat transfer fluid is received in the receiving portion and at least submerges the boiler plate, and a specific gravity of the first disturbing element is substantially equal to a specific gravity of the heat transfer fluid.

8. The immersion cooling system according to claim 1, wherein the immersion unit comprises a bracket, the boiler plate is in the bracket, the first maintaining element comprises a first maintaining string, one of two ends of the first maintaining string is maintained at the bracket, and another end of the first maintaining string is maintained at the first disturbing element.

9. The immersion cooling system according to claim 8, further comprising the heat transfer fluid, wherein the heat transfer fluid is received in the receiving portion and at least submerges the boiler plate, a specific gravity of the first disturbing element is substantially equal to a specific gravity of the heat transfer fluid, and the first maintaining string is maintained at an upper side of the bracket.

10. The immersion cooling system according to claim 8, further comprising the heat transfer fluid, wherein the heat transfer fluid is received in the receiving portion and at least submerges the boiler plate, a specific gravity of the first disturbing element is substantially equal to a specific gravity of the heat transfer fluid, and the first maintaining string is maintained at a lower side of the bracket.

11. The immersion cooling system according to claim 1, wherein the first convex surface has a curvature radius ranging between 5 mm and 10 mm, and the first predetermined distance ranges between 10 mm and 30 mm.

12. The immersion cooling system according to claim 1, wherein the immersion unit further comprises:
a main body frame; and
an electronic device in the main body frame and comprising a heating element contacting the boiler plate.

13. The immersion cooling system according to claim 1, wherein the first maintaining element comprises;
a resilient element with elasticity, and
the resilient element is between the first disturbing element and a supporting seat of the first maintaining element.

14. The immersion cooling system according to claim 1, wherein the first maintaining element comprises:
a resilient element, both the first disturbing element and the resilient element are magnetic, and
the resilient element is between the first disturbing element and a supporting seat of the first maintaining element.

15. The immersion cooling system according to claim 1, further comprising a rotation-disturbing element, a rotation-disturbing driver, a jetting element, and a jetting driver, wherein each of the rotation-disturbing element and the jetting element is adjacent to the first disturbing element, the rotation-disturbing element is driven by the rotation-disturbing driver to generate a disturbance to a direction toward the first disturbing element, and the jetting element is driven by the jetting driver to generate another disturbance to a direction toward the first disturbing element.

16. The immersion cooling system according to claim 15, wherein the rotation-disturbing element and the jetting element are respectively at two opposite sides of the first disturbing element.

17. The immersion cooling system according to claim 1, further comprising the heat transfer fluid received in the receiving portion, wherein the heat transfer fluid at least submerges the boiler plate, and the boiler plate faces a surface of the heat transfer fluid.

18. The immersion cooling system according to claim 1, further comprising the heat transfer fluid received in the receiving portion, wherein the heat transfer fluid at least submerges the boiler plate, and a main surface of the boiler plate is substantially parallel to a vertical line.

19. The immersion cooling system according to claim 1, further comprising a plurality of the cooling tanks including the cooling tank, a plurality of the first disturbing elements including the first disturbing element, and a plurality of the first maintaining elements including the first maintaining element, wherein each of the cooling tanks corresponds to a corresponding one of the first disturbing elements and a corresponding one of the first maintaining elements.

20. An immersion cooling system comprising:
a cooling tank having a receiving portion configured to receive a heat transfer fluid;
an immersion unit in the receiving portion and comprising a boiler plate configured to heat the heat transfer fluid to generate bubbles around the boiler plate;
a first disturbing element having a first convex surface;
a first maintaining element maintaining the first disturbing element to allow a convex direction of the first convex surface towards the boiler plate so that the bubbles are guided by the first convex surface to locations away from the convex surface, wherein a first predetermined distance is between the first convex surface and the boiler plate;

a rotation-disturbing element adjacent to the first disturbing element; and a rotation-disturbing driver, wherein the rotation-disturbing element is driven by the rotation-disturbing driver to generate a disturbance to a direction toward the first disturbing element.

21. An immersion cooling system comprising:

a cooling tank having a receiving portion configured to receive a heat transfer fluid;

an immersion unit in the receiving portion and comprising a boiler plate configured to heat the heat transfer fluid to generate bubbles around the boiler plate;

a first disturbing element having a first convex surface;

a first maintaining element maintaining the first disturbing element to allow a convex direction of the first convex surface towards the boiler plate so that the bubbles are guided by the first convex surface to locations away from the convex surface, wherein a first predetermined distance is between the first convex surface and the boiler plate;

a jetting element adjacent to the first disturbing element; and a jetting driver, wherein the jetting element is driven by the jetting driver to generate a disturbance to a direction toward the first disturbing element.

22. An immersion cooling system comprising:

a cooling tank having a receiving portion configured to receive a heat transfer fluid;

an immersion unit in the receiving portion and comprising a boiler plate configured to heat the heat transfer fluid to generate bubbles around the boiler plate;

a first disturbing element having a first convex surface;

a first maintaining element maintaining the first disturbing element in a position such that the first convex surface faces the boiler plate and the bubbles are guided by the first convex surface to locations away from the convex surface, wherein a first predetermined distance is between the first convex surface and the boiler plate; and a condenser arranged above the first disturbing element and configured to absorb heat of a gas-phase of the heat transfer fluid vaporized from a liquid-phase of the heat transfer fluid.

* * * * *